(12) United States Patent
Jiang et al.

(10) Patent No.: US 10,619,838 B2
(45) Date of Patent: Apr. 14, 2020

(54) LED LAMP WITH A COUNTERWEIGHT ON POWER BOARD OF POWER SOURCE

(71) Applicant: JIAXING SUPER LIGHTING ELECTRIC APPLIANCE CO., LTD, Jiaxing (CN)

(72) Inventors: Tao Jiang, Jiaxing (CN); Mingbin Wang, Jiaxing (CN); Aiming Xiong, Jiaxing (CN); Lin Zhou, Jiaxing (CN)

( * ) Notice: Subject to any disclaimer, the term of this patent is extended or adjusted under 35 U.S.C. 154(b) by 0 days.

(21) Appl. No.: 16/417,647

(22) Filed: May 21, 2019

(65) Prior Publication Data

US 2019/0271462 A1 Sep. 5, 2019

Related U.S. Application Data

(63) Continuation of application No. 16/267,747, filed on Feb. 5, 2019.

(30) Foreign Application Priority Data

Feb. 8, 2018 (CN) .......................... 2018 1 0130085
May 18, 2018 (CN) .......................... 2018 1 0479044

(Continued)

(51) Int. Cl.
*F21V 29/503* (2015.01)
*F21K 9/235* (2016.01)
(Continued)

(52) U.S. Cl.
CPC ............ *F21V 29/503* (2015.01); *F21K 9/235* (2016.08); *F21K 9/237* (2016.08); *F21K 9/238* (2016.08);
(Continued)

(58) Field of Classification Search
CPC ...... F21V 29/503; F21V 29/83; F21V 29/773; F21V 7/0025; F21K 9/235; F21K 9/237;
(Continued)

(56) References Cited

U.S. PATENT DOCUMENTS 7,748,870 B2 * 7/2010 Chang ................... F21V 29/004
362/294
9,897,304 B2 * 2/2018 Shum ................... H05B 33/089
(Continued)

FOREIGN PATENT DOCUMENTS

CN 201606689 U 10/2010
CN 201651880 U 11/2010
(Continued)

*Primary Examiner* — Ali Alavi
(74) *Attorney, Agent, or Firm* — Simon Kuang Lu

(57) ABSTRACT

An LED lamp includes: a lamp head; a passive heat dissipating element having a heat sink; a power source; a light emitting surface comprising LED chips electrically connected to the power source; a first heat dissipating channel; a second heat dissipating channel; and a lamp cover; wherein the first heat dissipating channel comprises a first end and a second end; wherein the second heat dissipating channel comprises a third end on the light emitting surface; wherein the power board is divided into a first mounting zone and a second mounting zone, total weight of the electronic components on the second mounting zone is greater than total weight of the electronic components on the first mounting zone, the first mounting zone is provided with a counterweight to balance the two zones of the power board in weight.

17 Claims, 18 Drawing Sheets

(30) Foreign Application Priority Data

| | | | |
|---|---|---|---|
| May 28, 2018 | (CN) | .......................... | 2018 1 0523952 |
| Jun. 6, 2018 | (CN) | .......................... | 2018 1 0573322 |
| Jun. 20, 2018 | (CN) | .......................... | 2018 1 0634571 |
| Jul. 12, 2018 | (CN) | .......................... | 2018 1 0763089 |
| Jul. 12, 2018 | (CN) | .......................... | 2018 1 0763800 |
| Aug. 24, 2018 | (CN) | .......................... | 2018 1 0972904 |
| Oct. 9, 2018 | (CN) | .......................... | 2018 1 1172470 |
| Nov. 1, 2018 | (CN) | .......................... | 2018 1 1295618 |
| Nov. 2, 2018 | (CN) | .......................... | 2018 1 1299410 |
| Nov. 13, 2018 | (CN) | .......................... | 2018 1 1347198 |
| Nov. 19, 2018 | (CN) | .......................... | 2018 1 1378174 |
| Dec. 3, 2018 | (CN) | .......................... | 2018 1 1466198 |

(51) Int. Cl.

| | |
|---|---|
| *F21V 29/77* | (2015.01) |
| *F21K 9/238* | (2016.01) |
| *F21K 9/237* | (2016.01) |
| *F21V 29/83* | (2015.01) |
| *F21K 9/66* | (2016.01) |
| *H05B 33/08* | (2020.01) |
| *F21K 9/68* | (2016.01) |
| *F21V 7/00* | (2006.01) |
| *H03H 11/04* | (2006.01) |
| *F21Y 115/10* | (2016.01) |
| *F21Y 105/18* | (2016.01) |
| *H03H 7/01* | (2006.01) |

(52) U.S. Cl.
CPC .................. *F21K 9/66* (2016.08); *F21K 9/68* (2016.08); *F21V 7/0025* (2013.01); *F21V 29/773* (2015.01); *F21V 29/83* (2015.01); *H05B 33/0812* (2013.01); *H05B 33/0884* (2013.01); *F21Y 2105/18* (2016.08); *F21Y 2115/10* (2016.08); *H03H 7/0115* (2013.01); *H03H 11/04* (2013.01)

(58) Field of Classification Search
CPC ... F21K 9/238; F21K 9/66; F21K 9/88; H05B 33/0812; H05B 33/0884; F21Y 2115/10; F21Y 2105/18
USPC .......................................................... 362/294
See application file for complete search history.

(56) References Cited

U.S. PATENT DOCUMENTS

| | | | |
|---|---|---|---|
| 2007/0230188 A1 | | 10/2007 | Lin |
| 2012/0085516 A1* | | 4/2012 | McClellan ............ F21V 15/013 165/80.3 |
| 2016/0025322 A1* | | 1/2016 | Chen .................... F21V 29/773 362/373 |

FOREIGN PATENT DOCUMENTS

| | | |
|---|---|---|
| CN | 102032491 A | 4/2011 |
| CN | 102374427 A | 3/2012 |
| CN | 102859256 A | 1/2013 |
| CN | 203190364 U | 9/2013 |
| CN | 203442750 U | 2/2014 |
| CN | 203656721 U | 6/2014 |
| CN | 204114712 U | 1/2015 |
| CN | 104728631 A | 6/2015 |
| CN | 204717489 U | 10/2015 |
| CN | 204785745 U | 11/2015 |
| CN | 107345628 A | 11/2017 |
| CN | 108368977 A | 8/2018 |
| KR | 100932192 B1 | 12/2009 |

* cited by examiner

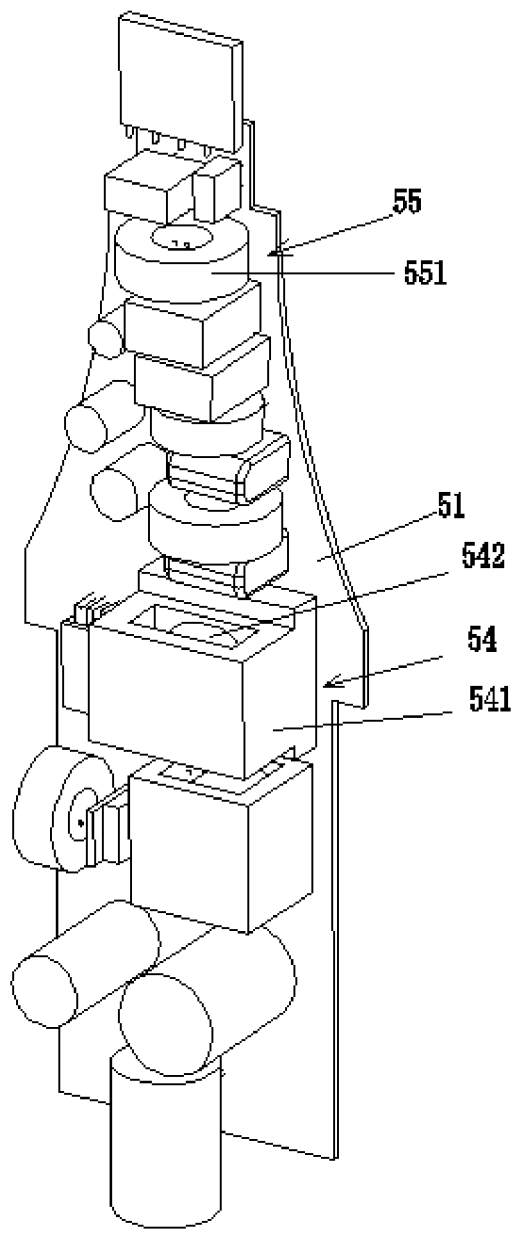
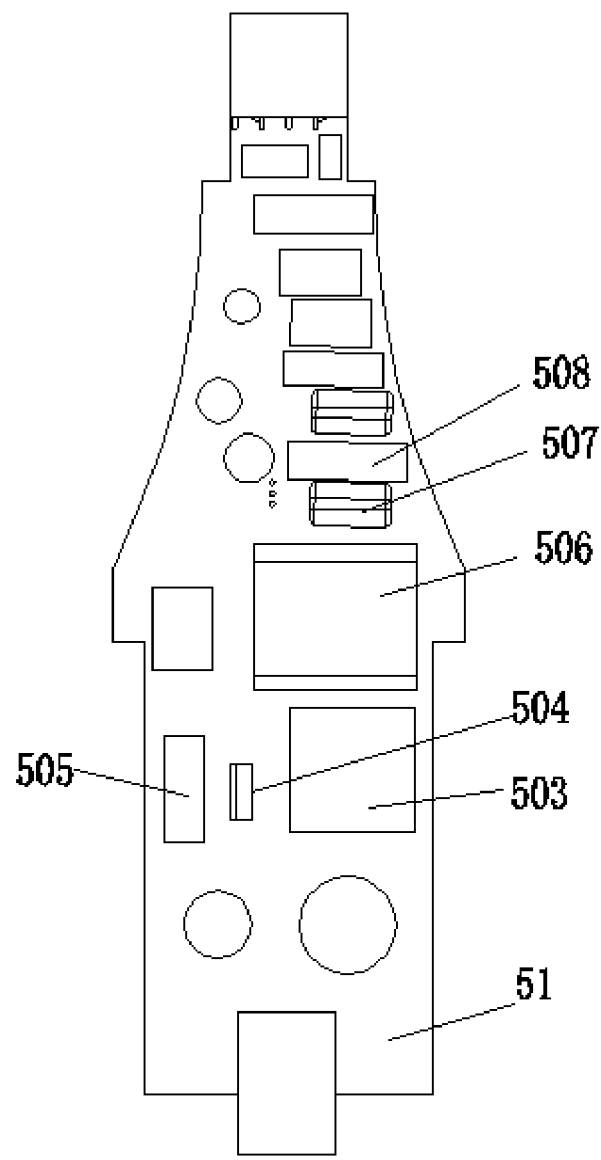
FIG. 14C                    FIG. 14D

LED LAMP WITH A COUNTERWEIGHT ON POWER BOARD OF POWER SOURCE

CROSS-REFERENCE TO RELATED APPLICATIONS

This application is a continuation application of U.S. application Ser. No. 16/267,747 filed on 2019 Feb. 5, which claims priority to the following Chinese Patent Applications No. CN 201810130085.3 filed on 2018 Feb. 8, CN 201810479044.5 filed on 2018 May 18, CN 201810523952.X filed on 2018 May 28, CN 201810573322.3 filed on 2018 Jun 6, CN 201810634571.9 filed on 2018 Jun. 20, CN 201810763800.7 field on 2018 Jul. 12, CN 201810763089.5 filed on 2018 Jul. 12, CN 201810972904.9 filed on 2018 Aug. 24, CN 201811172470.0 filed on 2018 Oct. 9, CN 201811295618.X filed on 2018 Nov. 1, CN 201811299410.5 filed on 2018 Nov. 2, CN 201811347198.5 filed on 2018 Nov. 13, CN 201811378174.6 filed on 2018 Nov. 19, and CN 201811466198.7 filed on 2018 Dec. 3, the disclosures of which are incorporated herein in their entirety by reference.

FIELD OF THE INVENTION

The invention relates to lighting, particularly to LED lamps with a counterweight on power board of power source.

BACKGROUND OF THE INVENTION

Because LED lamps possess advantages of energy saving, high efficiency, environmental protection and long life, they have been widely adopted in the lighting field. For LED lamps used as an energy-saving green light source, a problem of heat dissipation of high-power LED lamps becomes more and more important. Overheating will result in attenuation of lighting efficiency. If waste heat from working high-power LED lamps cannot be effectively dissipated, then the life of LED lamps will be directly negatively affected. As a result, in recent years, solution of the problem of heat dissipation of high-power LED lamps is an important issue for the industry.

OBJECT AND SUMMARY OF THE INVENTION

The LED lamp described in the present disclosure includes an LED (light emitting diode) lamp including a lamp shell including a lamp head, a lamp neck and a sleeve, the lamp head connects to the lamp neck which connects to the sleeve; a passive heat dissipating element having a heat sink connected to the lamp shell, wherein the heat sink comprises fins and a base, the sleeve of the lamp shell is located in the heat sink, the lamp neck projects from the heat sink, height of the lamp neck is at least 80% of height of the heat sink; a power source having a first portion and a second portion, wherein the first portion of the power source is disposed in both the lamp neck and the lamp head of the lamp shell, and the second portion of the power source is disposed in the heat sink of the passive heat dissipating element; a light emitting surface connected to the heat sink of the passive heat dissipating element and comprising LED chips electrically connected to the power source, wherein the light emitting surface and the heat sink are connected to form a heat transferring path from the LED chips to the passive heat dissipating element; a first heat dissipating channel formed in a first chamber of the lamp shell for dissipating heat generated from the power source while the LED lamp is working, and the first chamber is located between the bottom of the LED lamp and the upper portion of the lamp neck; a second heat dissipating channel formed in the heat sink and between the fins and the base for dissipating the heat generated from the LED chips and transferred to the heat sink; and a lamp cover connected with the heat sink and having a light output surface and an end surface, wherein the end surface is formed with a vent to allow air flowing from outside of the LED lamp into both the first heat dissipating channel and the second heat dissipating channel through the vent; wherein the first heat dissipating channel comprises a first end on the light emitting surface to allow air flowing from outside of the LED lamp into the first chamber, and a second end on the upper portion of the lamp neck of the lamp shell to allow air flowing from inside of the first chamber out to the LED lamp; wherein the second heat dissipating channel comprises a third end on the light emitting surface to allow air flowing from outside of the LED lamp into the second heat dissipating channel, and flowing out from spaces between every adjacent two of the fins; wherein the power source includes a power board and a plurality of electronic components mounted thereon; wherein the power board is divided into a first mounting zone and a second mounting zone, total weight of the electronic components on the second mounting zone is greater than total weight of the electronic components on the first mounting zone, and a counterweight is provided on the first mounting zone to balance the two zones of the power board in weight.

Preferably, the first heat dissipating channel includes an inner channel and an outer channel, the outer channel is formed between the electronic components on an edge of the power board and an inner wall of the first chamber of the lamp shell, the inner channel is formed in gaps between the electronic components, a transformer of the electronic components includes a core and coils, the core has a second chamber in which the coils are disposed, an opening is formed at a side of the second chamber in a radial direction to expose the coils, the opening corresponds to the inner channel or the outer channel.

Preferably, two openings are separately formed at two sides of the second chamber in a radial direction, one of the two openings corresponds to the inner channel and the other one thereof corresponds to the outer channel.

Preferably, the electronic components include heat-generating elements, at least one of the heat-generating element is in thermal contact with the lamp head through a thermal conductor, the at least one of the heat-generating element is disposed in the lamp head.

Preferably, the thermal conductor is disposed in the lamp head through filling to implement connection between the lamp head and the heat-generating element, the thermal conductor only cloaks an end portion of the power source and is higher than the second end on the upper portion of the lamp neck of the lamp shell in position.

Preferably, the lamp head includes a metal portion, at least part of an inner side of the metal portion constitutes a wall of the inner chamber of the lamp shell to make the thermal conductor directly connect with the metal portion.

Preferably, at least one of the electronic components of the power source, which is most adjacent to the first end of the first heat dissipating channel is an electrolytic capacitor.

Preferably, part of the electrolytic capacitor exceeds the power board in the axial direction of the LED lamp.

Preferably, the counterweight is a heat dissipating element with heat dissipating function and is disposed on the power board.

Preferably, the heat dissipating assembly has fins for increasing heat dissipating area, the fins are extendedly arranged along the axial direction of the LED lamp, a channel is formed between two adjacent fins as an air passage.

Preferably, an aperture is located in a central region of the light board, and the aperture forms an air intake of both the first heat dissipating channel and the second heat dissipating channel.

Preferably, the sleeve corresponds to the aperture.

Preferably, the heat sink comprises first fins and second fins, bottoms of both the first fins and the second fins in an axis of the LED lamp connect to the base, the first fins interlace with the second fins at regular intervals, and one of the second fins includes a third portion and two fourth portions, the two fourth portions are symmetrical about the third portion.

Preferably, each of the first fins is divided into two portions in a radial direction of the LED lamp, the two portions are divided with a gap portion, the third portion is connected to the fourth portion through a transition portion, the transition portion has a buffer section and a guide section, a direction of any tangent of the guide section is separate from the gap portion.

Preferably, the power board has a first portion in the lamp neck and a second portion in the sleeve, the second portion more adjacent to the first end of the first heat dissipating channel than the first portion.

Preferably, at least part of the electrolytic capacitors are disposed in the second portion.

Preferably, all of the electrolytic capacitors are disposed in the second portion.

BRIEF DESCRIPTION OF THE DRAWINGS

The following detailed descriptions, given by way of example, and not intended to limit the present invention solely thereto, will be best be understood in conjunction with the accompanying figures:

FIGS. 14A-14C are perspective views of the power source, according to some embodiments of the present invention;

FIG. 14D is a main view of the power source of the embodiment of FIGS. 14A-14C,

DETAILED DESCRIPTION OF THE EMBODIMENTS

To make the present invention understandable and readable, the following disclosure will now be described in the following embodiments with reference to the drawings. The following descriptions of various embodiments of this invention are presented herein for purpose of illustration and giving examples only.

Figure 1:
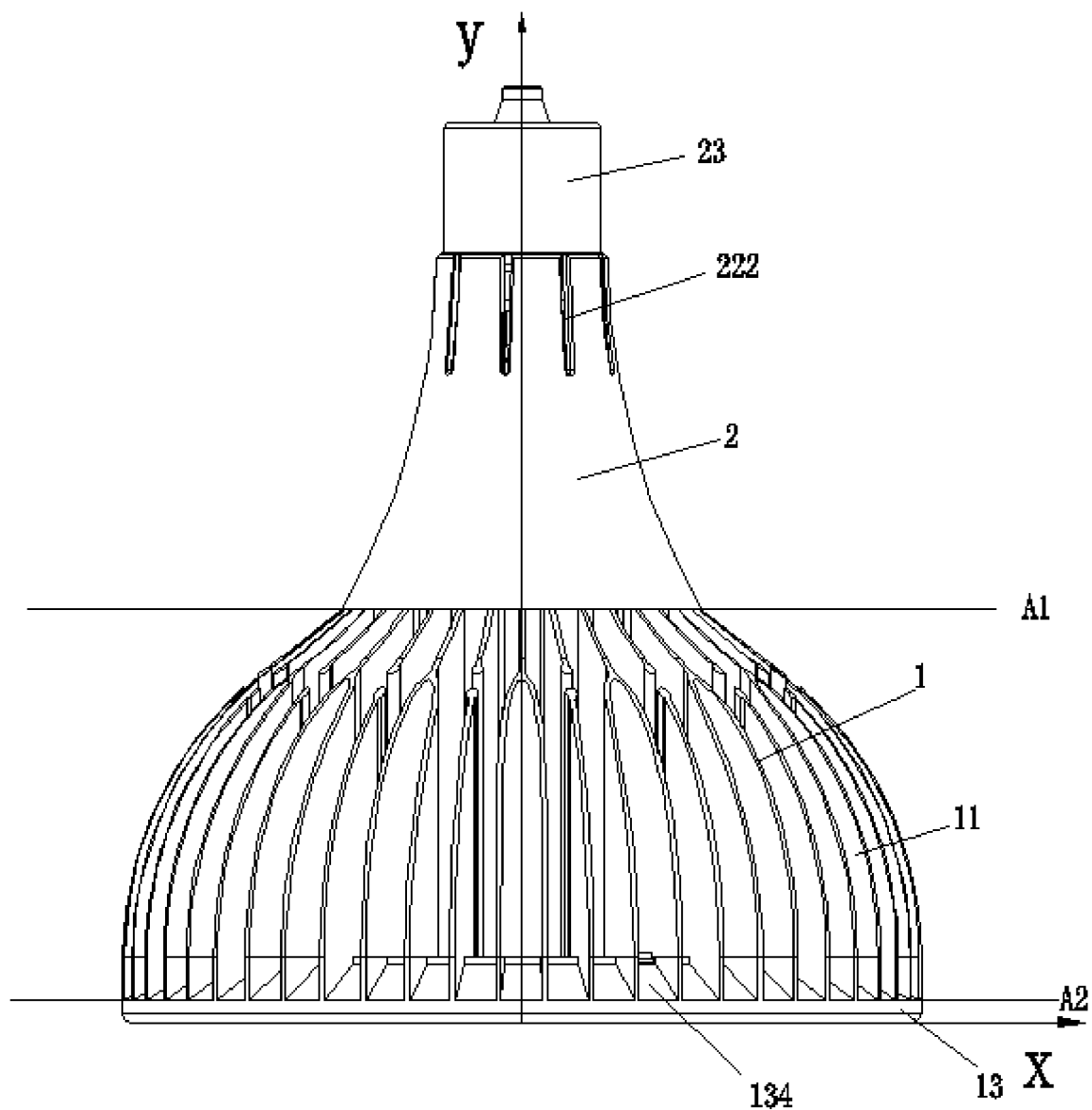
FIG. 1 is a structural schematic view of one embodiment of an LED lamp according to aspects of the invention.
Figure 2:
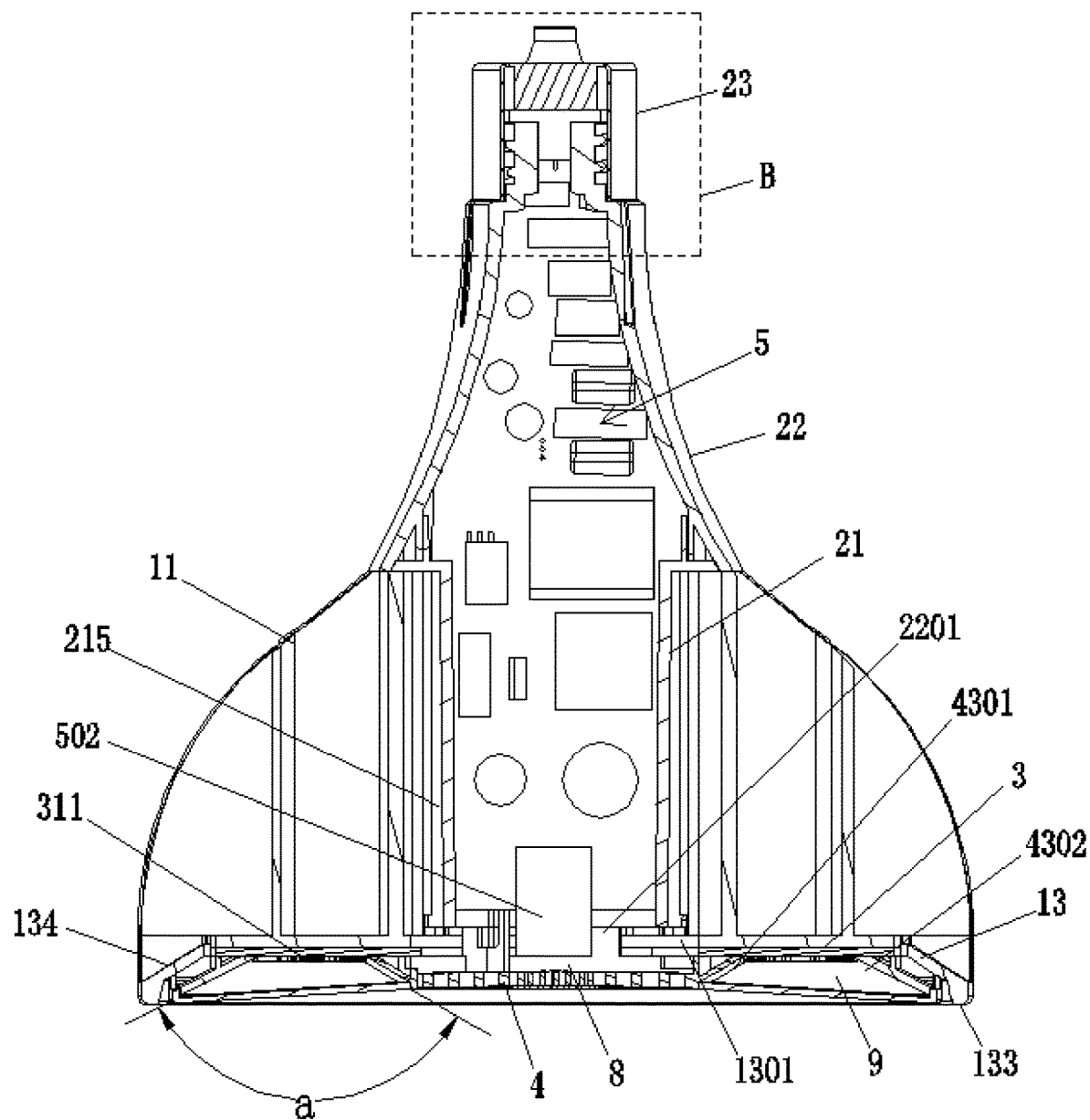
FIG. 2 is a schematic cross-sectional view of the LED lamp of FIG. 1.
Figure 3:
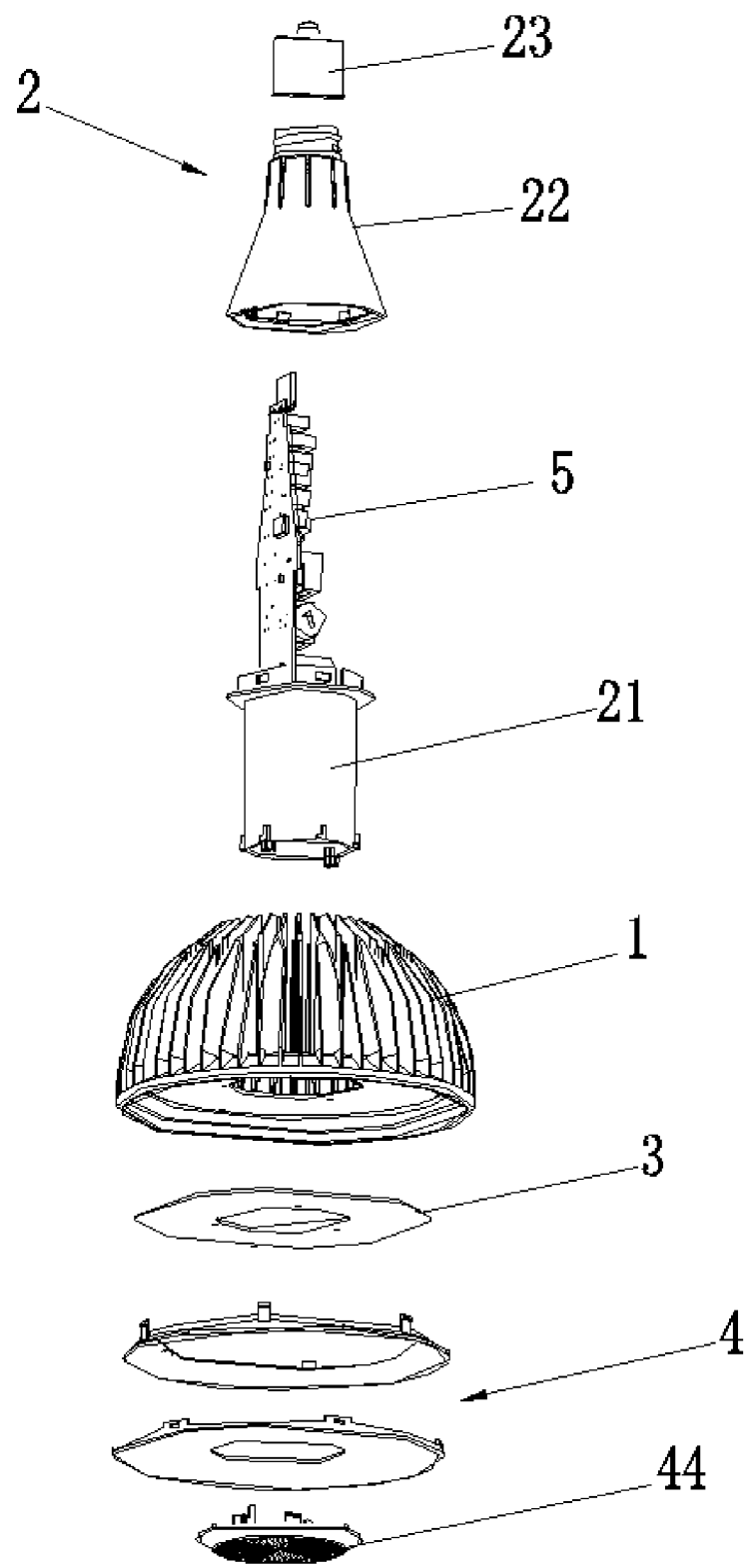
FIG. 3 is an exploded view of the LED lamp of FIG. 1.

FIG. 1 is a structural schematic view of an embodiment of an LED lamp according to certain aspects of the invention. FIG. 2 is a schematic cross-sectional view of the LED lamp of FIG. 1. FIG. 3 is an exploded view of the LED lamp of FIG. 1. As shown in the figures, the LED lamp includes a heat sink 1, a lamp shell 2, a light board 3, a lamp cover 4 and a power source 5. In this embodiment, the light board 3 is connected to the heat sink 1 by attachment for rapidly transferring heat from the light board 3 to the heat sink 1 when the LED lamp is working. In some embodiments, the light board 3 is riveted to the heat sink 1. In some embodiments, the light board 3 is screwed to the heat sink 1. In some embodiments, the light board 3 is welded to the heat sink 1. In some embodiments, the light board 3 is adhered to the heat sink 1. In this embodiment, the lamp shell 2 is connected to the heat sink 1, the lamp cover 4 covers the light board 3 to make light emitted from the light board 3 pass through the lamp cover to project out. The power source 5 is located in a chamber of the lamp shell 2 and the power source 5 is EC to the LED chips 311 for providing electricity.

Figure 4:
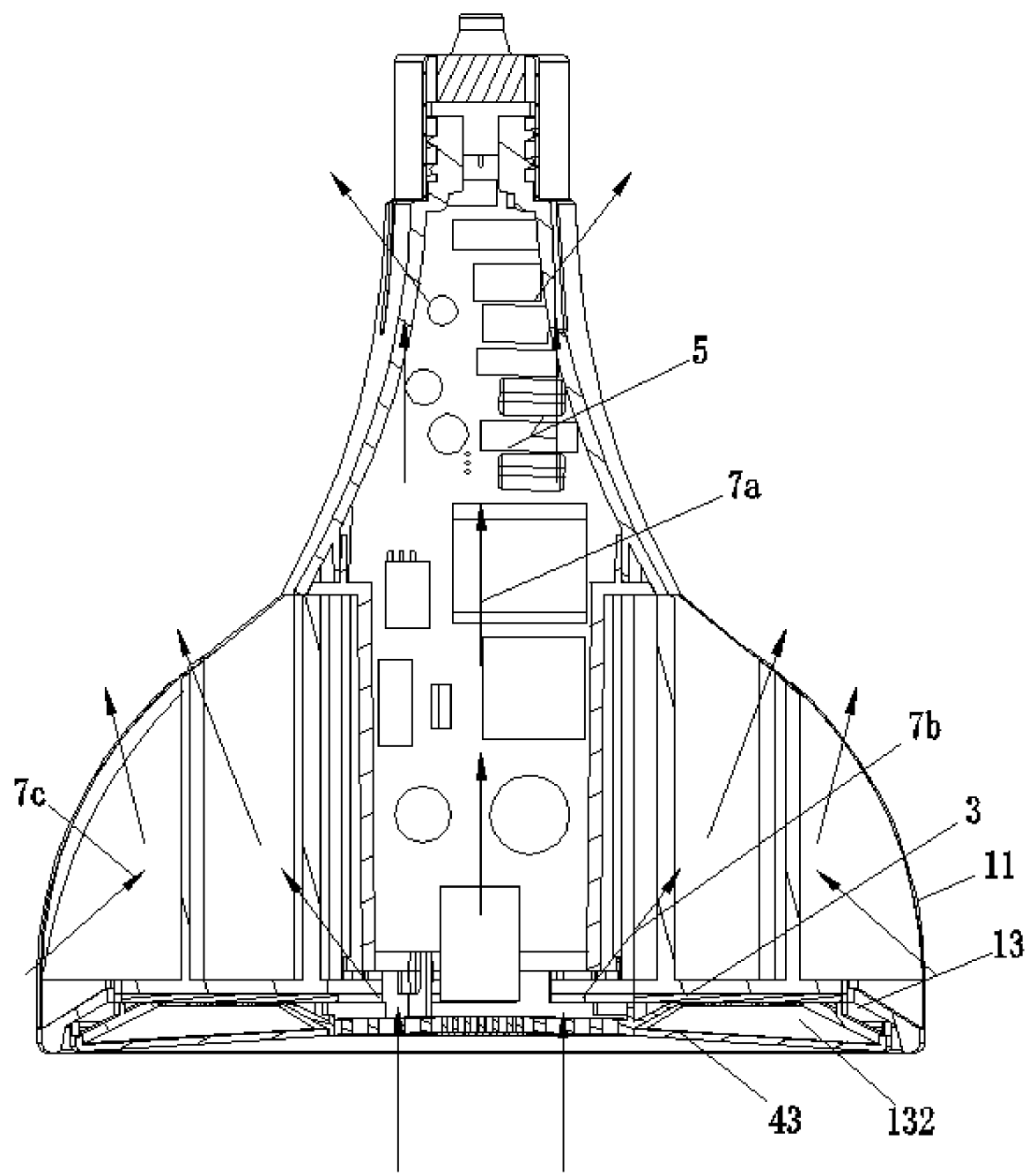
FIG. 4 is a schematic cross-sectional view of the LED lamp of FIG. 1, which shows the first heat dissipating channel and the second heat dissipating channel.

FIG. 4 is a schematic cross-sectional view of the LED lamp. As shown in FIGS. 2 and 4, the chamber of the lamp shell 2 of this embodiment is formed with a first heat dissipating channel 7a. An end of the first heat dissipating channel is formed with a first air inlet 2201. An opposite end of the lamp shell 2 is formed with a venting hole 222 (at an upper portion of the lamp neck 22). Air flows into the first heat dissipating channel 2201 and flows out from the venting hole 222 for bringing out heat in the first heat dissipating channel 7a (primarily, heat of the working power source 5). As for the path of heat dissipation, heat generated from the heat-generating components of the working power source 5 is transferred to air (around the heat-generating components) in the first heat dissipating channel 7a by thermal radiation first, and then external air enters the first heat dissipating channel 7a by convection to bring out internal air to make heat dissipation. In this embodiment, the venting hole 222 at the lamp neck 22 can also make direct heat dissipation.

As shown in FIGS. 1, 2 and 4, a second heat dissipating channel 7b is formed in the fins and the base 13 of the heat sink 1. The second heat dissipating channel 7b has a second air inlet 1301. In this embodiment, the first air inlet 2201 and the second air inlet 1301 share the same opening formed on the light board 3. This will be described in more detail later. Air flows from outside of the LED lamp into the second air inlet 1301, passes through the second heat dissipating channel 7b and finally flows out from spaces between the fins 11 so as to bring out heat of the fins 11 to enhance heat dissipation of the fins 11. As for the path of heat dissipation, heat generated from the LED chips is conducted to the heat sink 1, the fins 11 of the heat sink 1 radiate the heat to surrounding air, and convection is performed in the second heat dissipating channel 7b to bring out heated air in the heat sink 1 to make heat dissipation.

Figure 5:
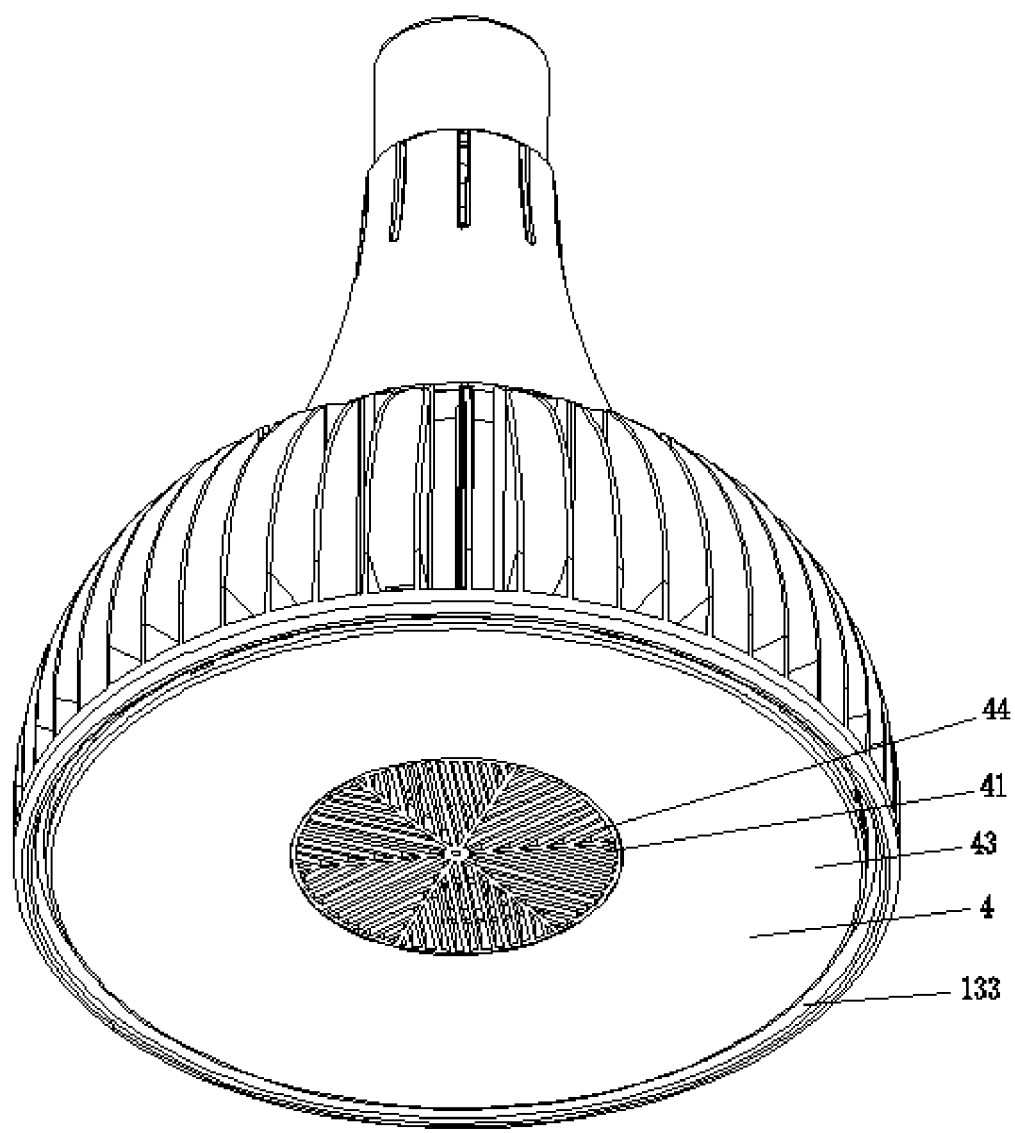
FIG. 5 is a perspective view of the LED lamp of FIG. 1.
Figure 6:
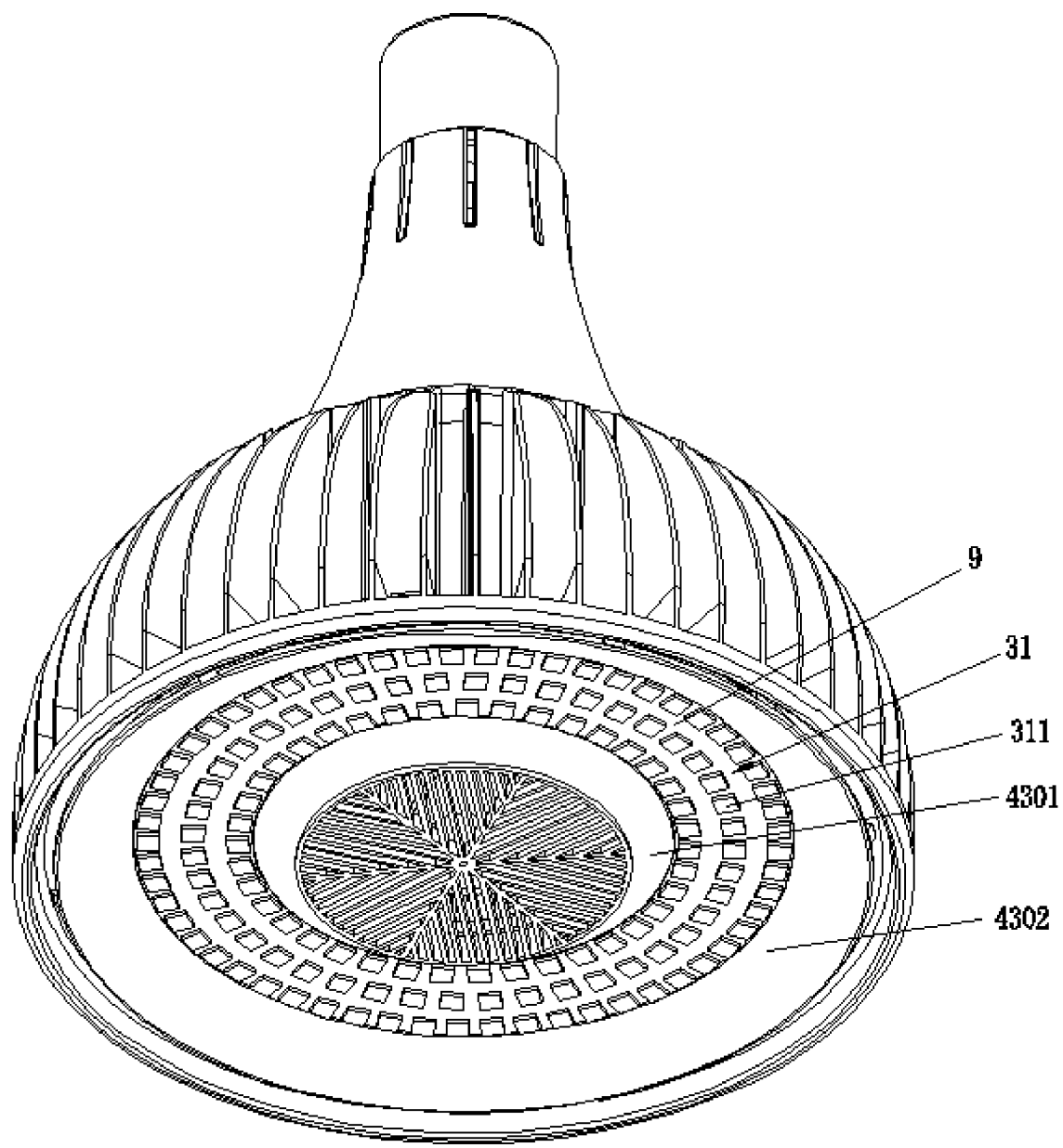
FIG. 6 is a structural schematic view of FIG. 5 without the light output surface.
Figure 7:
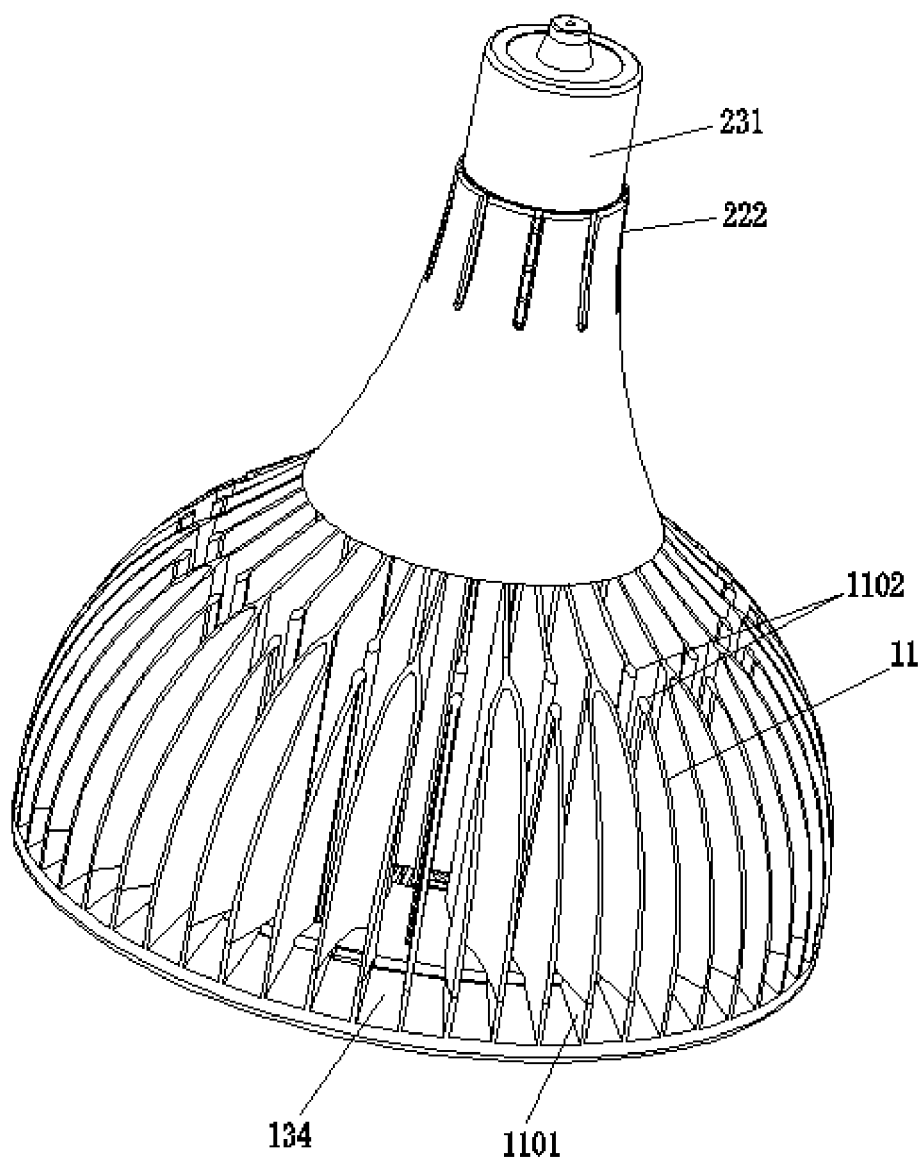
FIG. 7 is a perspective view of an LED lamp, according to another embodiment of the present invention.

FIG. 5 is a perspective view of the LED lamp of an embodiment, which shows assembling of the heat sink 1 and the lamp cover 4. FIG. 6 is a structural schematic view of FIG. 5 without the light output surface 43. As shown in FIGS. 5 and 6, in this embodiment, the lamp cover 4 includes a light output surface 43 and an end surface 44 with a vent 41. Air flows into both the first heat dissipating channel 7a and the second heat dissipating channel 7b through the vent 41. When the LED chips 311 (shown in FIG. 6) are illuminated, the light passes through the light output surface 43 to be projected from the lamp cover 4. The term "LED chip" mentioned in all embodiments of the invention means all light sources with one or more LEDs (light emitting diodes) as a main part, and includes but is not limited to an LED bead, an LED strip or an LED filament. Thus, the LED chip mentioned herein may be equivalent to an LED bead, an LED strip or an LED filament.

As shown in FIGS. 1 and 2, in this embodiment, the LED lamp includes passive heat dissipating elements which adopt natural convection and radiation as a heat dissipating manner without any active heat dissipating elements such as a fan. The passive heat dissipating element in this embodiment includes a heat sink 1 composed of fins 11 and a base 13. The fins 11 radially extend from and connect to the base 13. When using the LED lamp, at least part of heat from the LED chips 311 is conducted to the heat sink 1 by thermal conduction. At least part of heat occurring from the heat sink 1 is transferred to external air by thermal convection and radiation. A diameter of a radial outline of the heat sink 1, in a hanging status as shown in the figures, tapers off upward or is substantially in a taper shape for a better match with a lampshade.

Figure 9:
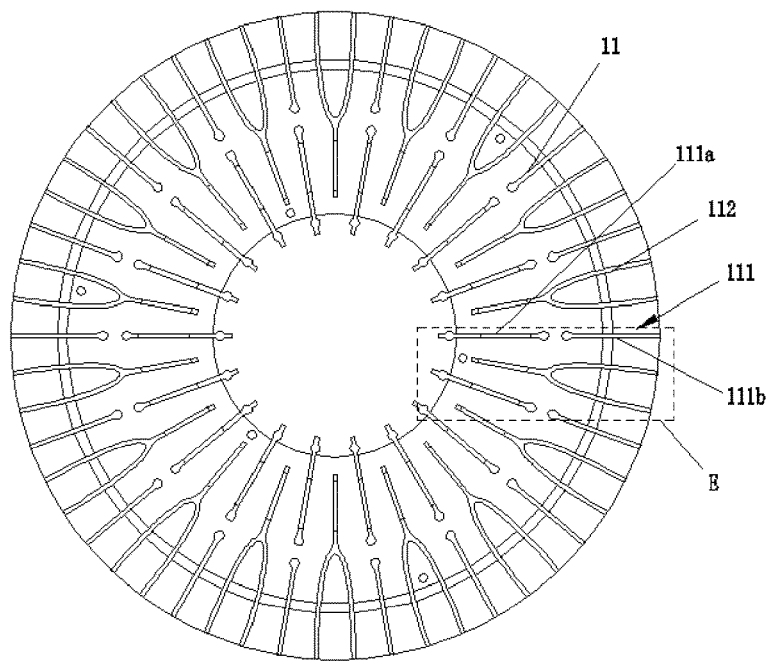
FIG. 9 is a top view of the heat sink of the LED lamp of FIG. 7.

FIG. 9 is top view of the heat sink 1 of the LED lamp of an embodiment. As shown, the heat sink 1 suffers the above volume limit, so at least part of the fins 11 are extended outward in a radial direction of the LED lamp with at least two sheets at an interval. By such an arrangement, the fins 11 in a fixed space can have larger area of heat dissipation.

In addition, the extended sheets form support to the fins 11 to make the fins firmly supported on the base 13 to prevent the fins 11 from deflecting.

In detail, as shown in FIG. 9, the fins include first fins 111 and second fins 112. The bottoms of both the first fins 111 and the second fins 112 in an axis of the LED lamp connect to the base 13. The first fins 111 interlace with the second fins 112 at regular intervals. Being projected from the axial direction of the LED lamp, each of the second fins 112 is to be seen as a Y-shape. Such Y-shaped second fins 112 can have more heat dissipating area under a condition of the heat sink 1 occupying the same volume. In this embodiment, both the first fins 111 and the second fins are evenly distributed on a circumference, respectively. Every adjacent two of the second fins 112 are symmetrical about one of the first fins 111.

As shown in FIG. 9, at least one of the fins 11 is divided into two portions in a radial direction of the LED lamp. Thus, a gap between the two portions forms a passage to allow air to pass. In addition, the projecting area of the gap directly exactly corresponds to an area that the LED chips 311 are positioned on the LED board 3 to enhance convection and improve an effect of heat dissipation to the LED chips 311. In an aspect of limited overall weight of the LED lamp, part of the fins 11 divided with a gap reduces the amount of the fins 11, decreases overall weight of the heat sink 1, and provides a surplus space to accommodate other elements.

Figure 10:
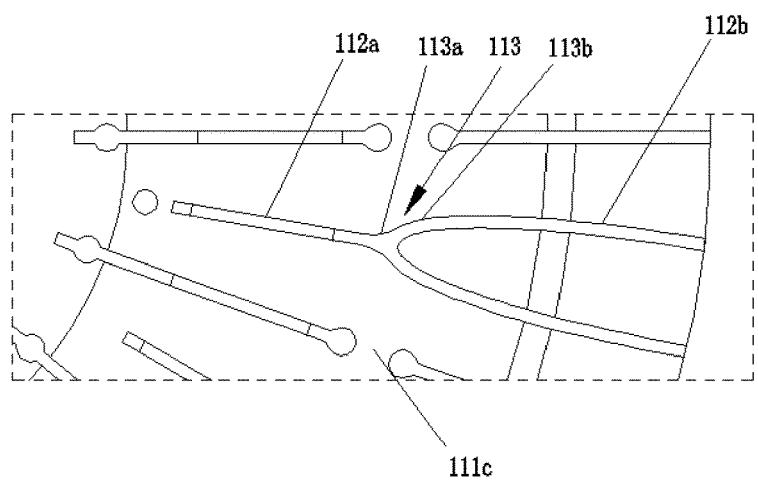
FIG. 10 is an enlarged view of portion E in FIG. 9.
Figure 11:
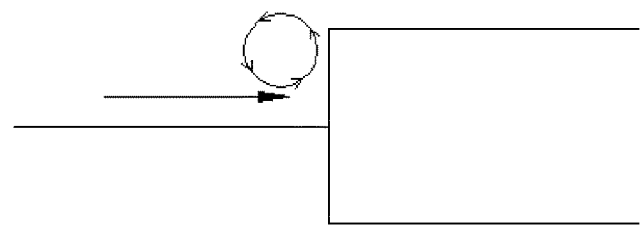
FIG. 11 is a schematic view showing a vortex formed by air near the second fins according to another embodiment of the present invention.

FIG. 10 is an enlarged view of portion E in FIG. 9. As shown in FIGS. 9 and 10, the fins 11 include first fins 111 and second fins 112. Each of the first fins 11 is divided into two portions in a radial direction of the LED lamp, i.e. a first portion 111a and a second portion 111b. The two portions are divided with a gap portion 111c. The first portion 111a is located inside the second portion 111b in a radial direction. Each of the second fins 112 has a third portion 112a and a fourth portion 112b extending therefrom. The fourth portions 112b are located radially outside the third portions 112a to increase space utilization and make the fins have more heat dissipating are for heat dissipation. As shown in FIG. 10, the third portion 112a is connected to the fourth portion 112b through a transition portion 113. The transition portion 113 has a buffer section 113a and a guide section 113b. At least one or both of the buffer section 113a and the guide section 113b are arced in shape. In other embodiment, both the buffer section 113a and the guide section 113b are formed into an S-shape or an inverted S-shape. The buffer section 113a is configured to prevent air radially outward flowing along the second fins 112 from being obstructed to cause vortexes. Instead, the guide section 113b is configured to be able to guide convection air to radially outward flow along the second fins 112 without interference (as shown id FIG. 11).

As shown in FIG. 10, one of the second fins 112 includes a third portion 112a and two fourth portions 112b. The two fourth portions 112b are symmetrical about the third portion 112a.

As shown in FIG. 10, a direction of any tangent of the guide section 113b is separate from the gap portion 111c to prevent convection air from flowing into the gap portion 111c through the guide portion 113b, such that the poor efficiency of heat dissipation caused by longer convection paths is able to be avoid as well. Preferably, a direction of any tangent of the guide section 113b is located radially outside the gap portion 111c. In other embodiments, a direction of any tangent of the guide section 113b is located radially inside the gap portion 111c.

Figure 12:
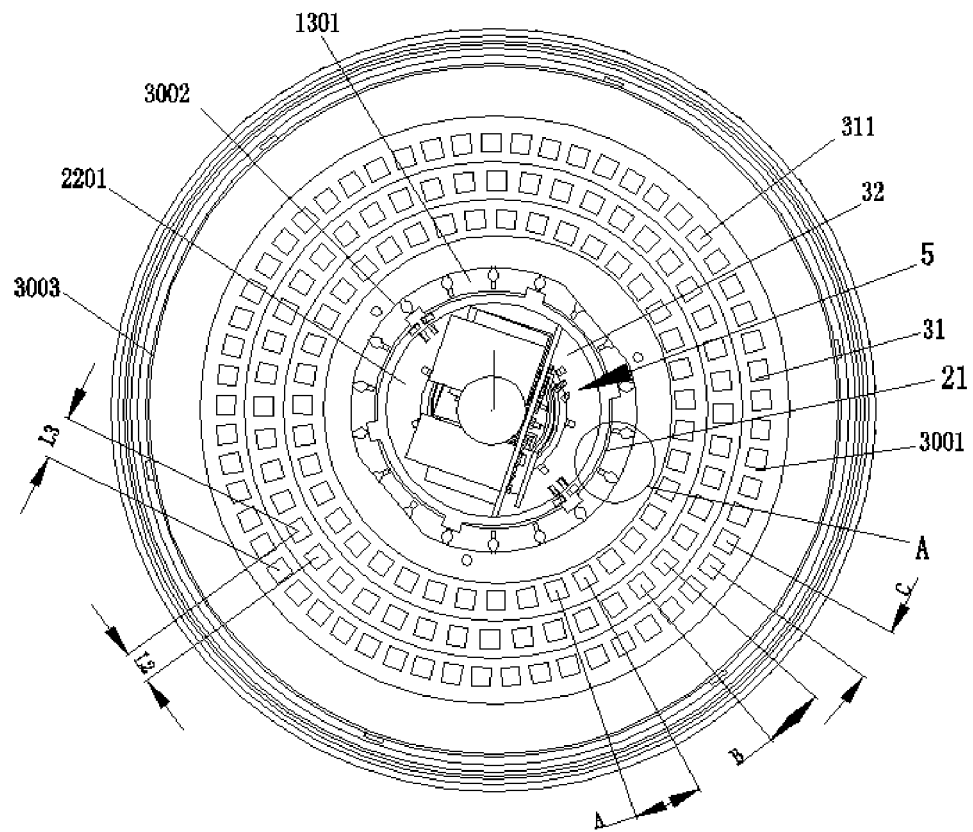
FIG. 12 is a bottom view of the LED lamp of FIG. 1 without the lamp cover.
Figure 13:
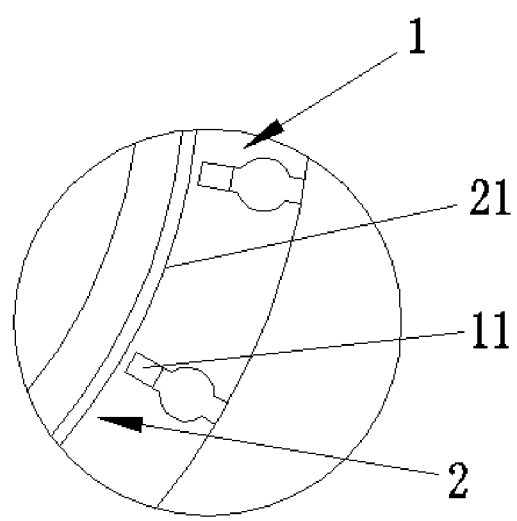
FIG. 13 is an enlarged view of portion A in FIG. 12.

FIG. 12 is a bottom view of the LED lamp of FIG. 1 without the lamp cover 4. FIG. 13 is an enlarged view of portion A in FIG. 12. As shown in FIGS. 12 and 13, the heat sink 1 is disposed outwardly of the sleeve 21, and the power source 5 is disposed in the inner space of the sleeve 21. A distance is kept between distal ends of the fins 11 and the sleeve 21. Accordingly, the sleeve 21 which has been heated to be thermally expanded will not be pressed by the fins 11 to be damaged. Also, heat from the fins 11 will not be directly conducted to the sleeve 21 to adversely affect electronic components of the power source 5 in the sleeve 21. Finally, air existing in the distance between the fins 11 and the sleeve 21 of the lamp shell 2(as shown in FIG. 3) possesses an effect of thermal isolation so as to further prevent heat of the heat sink 1 from affecting the power source 5 in the sleeve 21. In other embodiments, to make the fins 11 have radial support to the sleeve 21, distal ends of the fins 11 may be in contact with an outer surface of the sleeve 21 and another part of the fins 11 are not in contact with the sleeve 21. Such a design may be applied in the LED lamp shown in FIG. 12. As shown in FIG. 12, the light board 3 includes a third aperture 32 for exposing both the first air inlet 2201 of the first heat dissipating channel 7a and the second air inlet 1301 of the second heat dissipating channel 7b. In some embodiments, to rapidly dissipate heat from the power source 5, the ratio of cross-sectional area of the first air inlet 2201 to cross-sectional area of the second air inlet 1301 is greater than 1 but less than or equal to 2. In some embodiments, to rapidly dissipate heat from the power source 5, the ratio of cross-sectional area of the second air inlet 1301 to cross-sectional area of the first air inlet 2201 is greater than 1 but less than or equal to 1.5.

As shown in FIG. 12, in this embodiment, the light board 3 includes at least one LED chip set 31 having LED chips 311.

As shown in FIGS. 4 and 12, the light board 3 is formed with a third aperture 32 separately communicating with the first heat dissipating channel 7a and the second heat dissipating channel 7b. For example, the third aperture 32 communicates with spaces between the fins 11 and the chamber of the lamp shell 2 to form air convection paths between the spaces between the fins 11 and between the chamber of the lamp shell 2 and the outside of the Led lamp. The third aperture 32 is located inside the inner ring of the LED lamp. Thus, it would not occupy the space of the reflecting region 3001 to affect reflective efficiency. In detail, the third aperture 32 is located at a central region of the light board 3 and both the first air inlet 2201 and the second air inlet 1301 make air intake through the same aperture (the third aperture 32). In one example, after convection air passes through the third aperture 32, and then enters the first air inlet 2201 and the second air inlet 1301. The third aperture 32 is located at a central region of the light board 3, so both the first air inlet 2201 and the second air inlet 1301 can commonly use the same air intake. Thus, this can prevent occupying an excessive region of the light board 3 and prevent the usable regional area of the light board 3 for disposing the LED chips 311 from decreasing due to multiple air intakes. On the other hand, the sleeve 21 corresponds to the third aperture 32, so convection air may have an effect of thermal isolation to prevent temperatures inside and outside the sleeve 21 from mutually affecting each other when air enters. In other embodiments, if both the first air inlet 2201 and the second air inlet 1301 are located at different positions, then the third aperture 32 may be multiple in number to correspond to both the first air inlet 2201 and the second air inlet 1301.

Figure 14A:
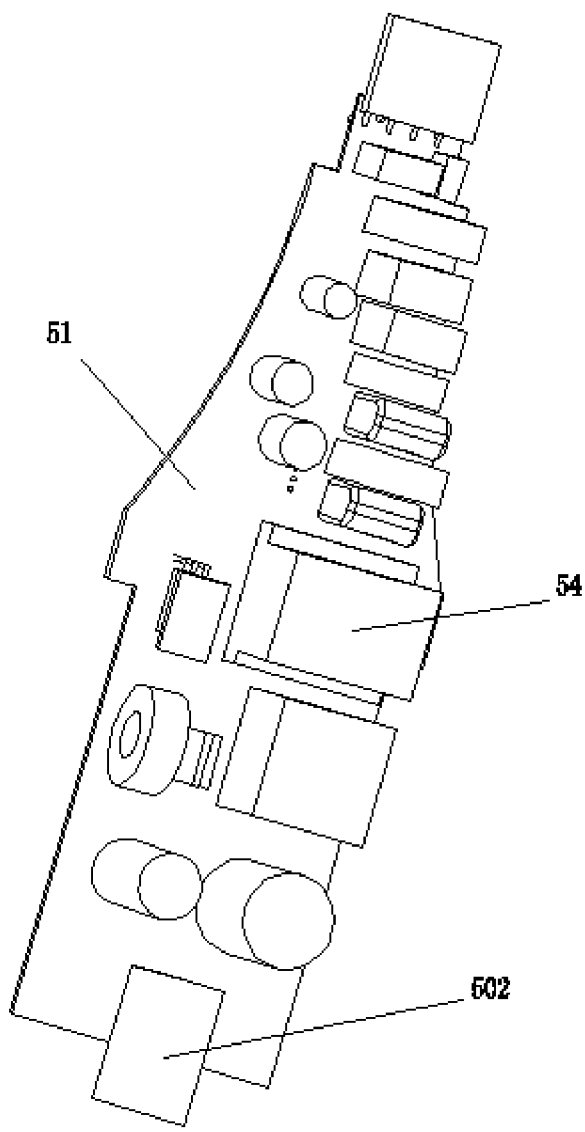
Figure 14B:
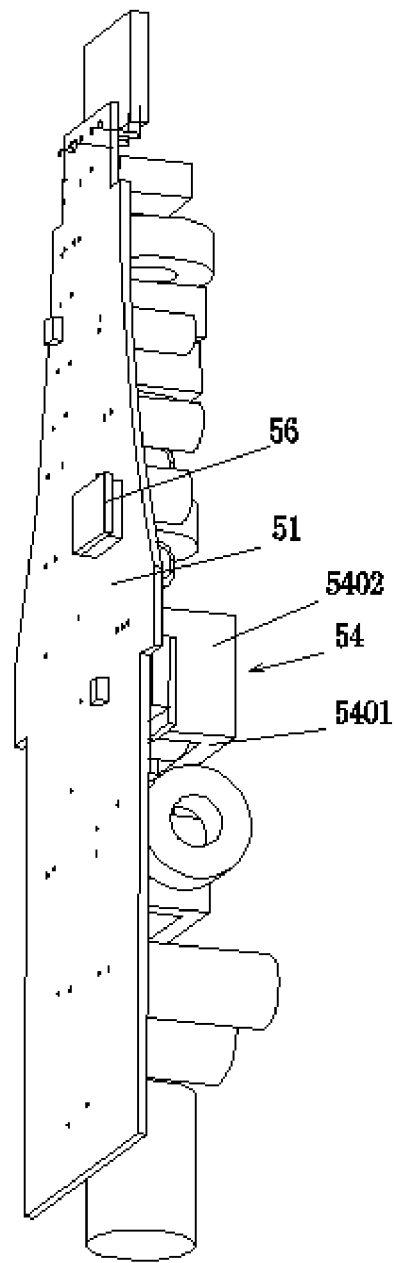

FIGS. 14A-14C are perspective views of the power source 5 of one embodiment at different viewpoints. FIG. 14D is a main view of the power source 5 of one embodiment. The power source 5 is electrically connected to the LED chips 311 to power the LED chips 311. As shown in FIGS. 14A-14C, the power source 5 includes a power board 51 and a plurality of electronic components mounted thereon.

As shown in FIG. 14C, a transformer 54 in the electronic components includes a core 541 and coils 542. The core 541 has a room in which the coil 542 is received. The room has an opening in the axial direction of the LED lamp so as to make heat generated from the coils 542 and the core 541 move upward. Also, the heat dissipating direction of the transformer 54 is consistent with the convection path of the first heat dissipating channel 7a (as mentioned in the description of FIG. 4) for being advantageous to heat dissipation.

As shown in FIGS. 14B and 14C, the room is provided with two openings at two ends in the axial direction of the LED lamp to increase heat dissipating effect to the coils 542. In addition, after the coils 542 are installed in the room of the core 541, a gap is kept between the coils 542 and the room to allow air to flow. This can further increase heat dissipating effect to the coils 542.

As shown in FIG. 14B, the transformer 54 has a first side 5401 and a second side 5402, both of which are perpendicular to the power board. The first side 5401 is perpendicular to the axial direction of the lamp. The first side 5401 is less than the second side 5402 in area. Thus, such an arrangement of the small side can reduce resistance to convection of the first heat dissipating channel 7a.

As shown in FIG. 14C, the electronic components include at least one inductor 55 including an annular core 551. A coil is wound around the annular core 551 (not shown). An axis of the annular core 551 is parallel to the axis of the LED lamp to make the coil have larger area to be in contact with convection air. This can further increase heat dissipating effect to the inductor 55. In addition, a shape of the annular core 551 corresponds to the convection path of the first heat dissipating channel 7a. Thus, convection air can pass through the inside of the annular core 551 to further increase heat dissipating effect to the inductor 55.

As shown in FIGS. 14A and 14B, heat-generating elements in the electronic components include integrated circuits (ICs) 56, diodes, transistors, the transformer 54, the inductor 55 and resistors. These heat-generating elements are separately mounted on the power board 51 to distribute heat-generating sources and prevent local high temperature. In addition, the heat-generating elements may be mounted on different surfaces of the power board 51 to perform heat dissipation. At this time, the heat-generating elements are in contact with corresponding heat dissipating elements.

As shown in FIGS. 14A and 14B, at least one IC 56 is arranged to be mounted on different surface as other heat-generating elements are arranged of the power board 51. As a result, the heat-generating sources can be separated to avoid local high temperature and influence to the IC 56 from the other heat-generating elements.

As shown in FIGS. 14A and 14B, in a direction perpendicular to the power board 51 (i.e. projection relationship in a direction perpendicular to the power board 51), the IC 56 does not overlap any heat-generating elements to avoid heat accumulation.

Figure 8:
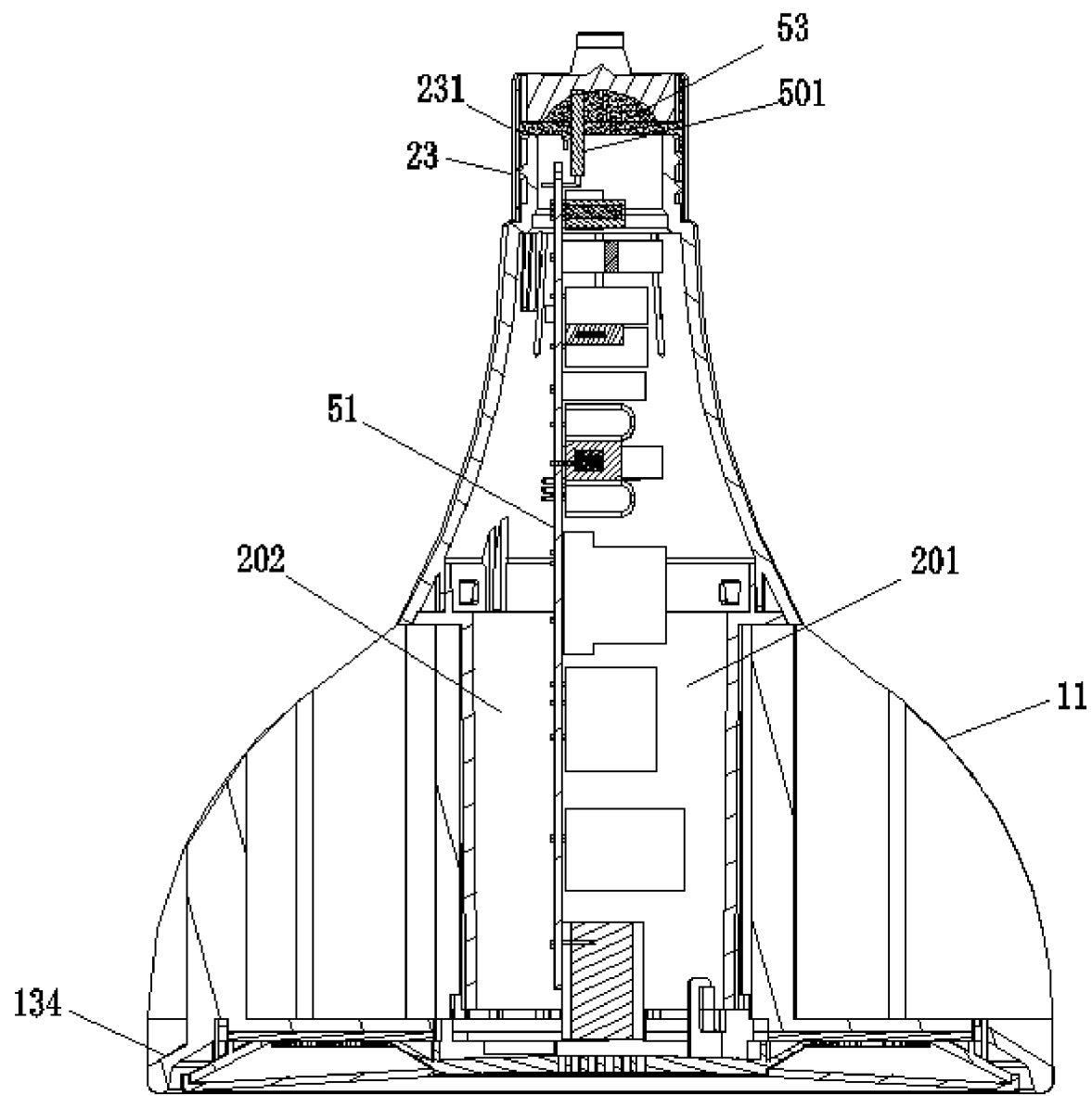
FIG. 8 is a cross-sectional view of the LED lamp of FIG. 7.

As shown in FIG. 8, the power board 51 is parallel to the axis of the LED lamp. Thus, in the axial direction of the LED lamp, the power board 51 is divided into an upper portion and a lower portion. Arranging spaces of both the upper portion and the lower portion are identical or approximately identical to form better layout of the electronic components. Besides, if the power board 51 inclines toward the axis of the LED lamp, then air flow may be obstructed and it is disadvantageous to heat dissipation of the power source 5.

As shown in FIGS. 1 and 8, the power board 51 divides the lamp shell 2 into a first portion 201 and a second portion 202. Area of the venting hole 222 corresponding to the first portion 201 is greater than area of the venting hole 222 corresponding to the second portion 202. Thus, when implementing layout of electronic components, most or all of electronic components or some thereof which generate a large amount of heat such as inductors, resistors, transformers, rectifiers or transistors may be disposed in the first portion 201.

As shown in FIG. 8, the power board 51 divides an inner chamber of the lamp shell 2 into a first portion 201 and a second portion 202. The first portion 201 is greater than the second portion 202 in volume. When implementing layout of electronic components, most or all of electronic components or some thereof which generate a large amount of heat such as inductors, resistors, transformers, rectifiers or transistors may be disposed in the first portion 201.

Please simultaneously refer to FIGS. 8 and 12, area of first air inlet 2201 corresponding to the first portion 201 is greater than area of the second air inlet 2202 corresponding to the second portion 202. Thus, more air can flow into the first portion 201 to perform heat dissipation to the electronic components. Here, the specific description of the air inlet is that the first air inlet 2201 is divided into two portions by the power board 51, one of the two portions corresponds to the first portion 201 and the other one of the two portions corresponds to the second portion 202 so as to make more air flow into the first air inlet 2201 and enter the first portion 201.

As shown in FIG. 8, the electronic components 501 include heat-generating elements 501. At least one of the heat-generating elements 501 is adjacent to the lamp head 23 through which heat is dissipated without occupying resource of heat dissipation of the first heat dissipating channel 7a. The at least one heat-generating element 501 abovementioned is an inductor, a resistor, a rectifier or a control circuit.

As shown in FIG. 8, heat of the at least one heat-generating element is transferred to the lamp head 23 through thermal conduction or radiation and dissipated to air through the lamp head 23.

As shown in FIG. 8, the at least one heat-generating element 501 is in thermal contact with the lamp head 23. In detail, the at least one heat-generating element 501 is located in the lamp head 23. The heat-generating element 501 is in contact with the lamp head 23 through a thermal conductor 53 and the heat-generating element 501 is fastened to the lamp head 23 through the thermal conductor 53. Therefore, the thermal conductor not only performs an effect of heat transfer but also fixes the heat-generating element 501 to avoid loosening of the heat-generating element 501. The phrase "the heat-generating element 501 is located in the lamp head 23" means both the lamp head 23 and the heat-generating element 501 have an overlapping area in a projection perpendicular to the axis of the LED lamp.

As shown in FIG. 8, the thermal conductor 53 is disposed in the lamp head 23 through filling to implement connection between the lamp head 23 and the heat-generating element 501. The thermal conductor 53 only cloaks an end portion of the power source 5 and is higher than the venting 222 in position to prevent overweight resulting from the thermal conductor 53. Additionally, the thermal conductor 53 adopts an insulative material to guarantee safety and prevent the electronic components and metal portion 231 of the lamp head 23 from being in contact. In other embodiments, the thermal conductor 53 may also be a wire connecting the power source 5 to the lamp head 23 (not shown).

As shown in FIG. 8, the lamp head 23 includes the metal portion 231, which is in thermal contact with the thermal conductor 53. That is, at least part of an inner side of the metal portion 231 constitutes a wall of the inner chamber of the lamp shell 2 to make the thermal conductor directly connect with the metal portion 231 and perform heat dissipation by the metal portion 231. Part of the metal portion 231 would perform heat dissipation through air, and another part of the metal portion would perform heat dissipation through a lamp socket connecting to the metal portion 231.

As shown in FIGS. 2 and 14A, in this embodiment, at least one of the electronic components of the power source 5, which is the most adjacent to the first air inlet 2201 of the first heat dissipating channel 7a is a heat intolerance component, such as a capacitor, especially for an electrolytic capacitor. This arrangement can avoid overheating of the heat intolerance component to affect its performance.

In addition, to reduce influence of an electrolytic capacitor 502 suffering heat from the heat-generating elements, a surface of the electrolytic capacitor can be provided with an anti-radiation layer or a thermo-isolation layer (not shown). The thermos-isolation layer may adopt existing plastic material, and the anti-radiation layer may adopt existing paint, silver plate layer, aluminum foil or other anti-radiation materials.

As shown in FIG. 14A, in this embodiment, at least part of at least one of the electrolytic capacitors 502 is not located within the power board 51, i.e. at least part of the electrolytic capacitor exceeds the power board 51 in the axial direction of the LED lamp. Under a condition of the same number of the electronic components, length and material cost of the power board 51. In addition, this can make the electrolytic capacitor further adjacent to the first air inlet 2201 to ensure the electrolytic capacitor to be located in a relatively low temperature area.

As shown in FIG. 8, a position of at least one of the heat-generating elements 501 in the axial direction of the LED lamp is higher than a position of the venting hole 222. Most heat of the heat-generating element 501 higher than the venting hole 222 is dissipated through the lamp head 23 or other paths. Thus, most heat therefrom is not dissipated through the venting hole 222, and convection speed of the first heat dissipating channel 7a would not be affected. The heat-generating element is an IC, a transistor, a transformer, an inductor, a rectifier or a resistor.

As shown in FIG. 8, the power board 51 is divided into an upper part and a lower part in the axial direction of the LED lamp. Heat-generating elements are arranged in both the upper part and the lower part. At least one of the heat-generating elements in the upper part is located above the venting hole 222 to lower the temperature of the upper part near the venting hole 222. This can increase an air temperature difference between two venting holes 222 in the upper part and the lower part to enhance convection.

As shown in FIGS. 2, 3 and 14A, when the power board 51 is assembled in the lamp shell 2, it has a first portion in the lamp neck 22 and a second portion in the sleeve 21. The second portion more adjacent to the first air inlet 2201 of the first heat dissipating channel 7a than the first portion. Because of such an arrangement, convention air will reach the second portion first. That is, the second portion is better than the first portion in an effect of heat dissipation. Thus, at least part of heat intolerance elements (e.g. electrolytic capacitors or other elements which is sensitive to high temperature) should be disposed in the second portion. Preferably, all electrolytic capacitors are disposed in the second portion. The power board 51 of the second portion is greater than the first portion in area, so the power board 51 of the second portion has more space for accommodating electronic components to be advantageous to more heat intolerance elements being disposed in the second portion. In this embodiment, heat intolerance elements/thermo-sensitive elements may be separately mounted on two opposite sides of the second portion. In other embodiments, hotter electronic components may be disposed in the second portion (e.g. transformers, inductors, resistors, ICs or transistors) for better heat dissipation.

Figure 15:
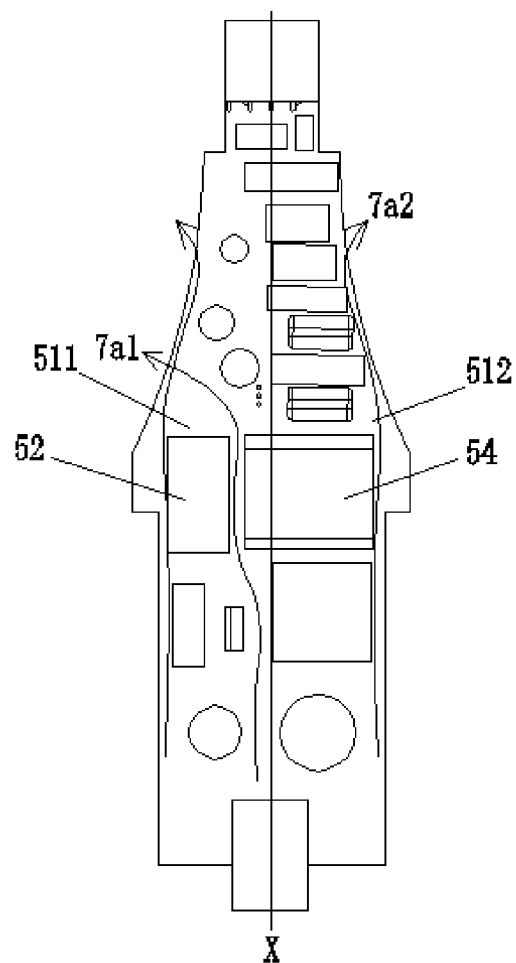
FIG. 15 is a schematic view of the power source, according to one embodiment of the present invention.

FIG. 15 is a schematic view of an embodiment of the power source 5, which can be applied to the power source 5 of the LED lamp shown in FIG. 4. As shown in FIG. 15, in some embodiments, the power board 51 is divided into a first mounting zone 511 and a second mounting zone 512 by an axis X. The axis X is between the first mounting zone 511 and the second mounting zone 512 as a border. Total weight of the electronic components on the second mounting zone 512 is greater than total weight of the electronic components on the first mounting zone 51. The first mounting zone 511 is provided with a counterweight 52 to balance the two zones 511, 512 of the power board 51 in weight. This can prevent unbalanced weight of the two zones 511, 512 of the power board 51 and prevent the hung LED lamp from tilting because of unbalanced weight.

Figure 16:
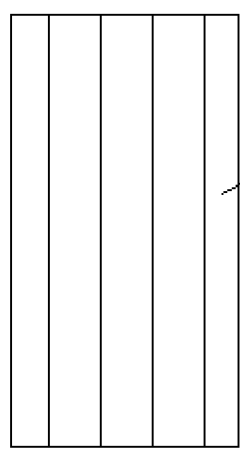
FIG. 16 is a main view of the counterweight of FIG. 15.
Figure 17:
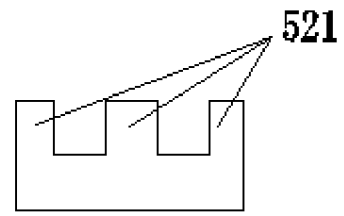
FIG. 17 is a side view of the counterweight of FIG. 16.

FIG. 16 is a main view of the counterweight 52 of FIG. 15. FIG. 17 is a side view of FIG. 16. As shown in FIGS. 16 and 17, in some embodiments, the counterweight 52 is a heat dissipating element with heat dissipating function and is disposed on the power board 51. In some embodiments, the heat dissipating assembly has fins 521 for increasing heat dissipating area. The counterweight 52 is made of metal with high thermoconductivity such as aluminum or copper. In this embodiment, the fins 521 are extendedly arranged along the axial direction of the LED lamp. A channel is formed between two adjacent fins 521 as an air passage. Such an arrangement can increase heat dissipating area of the counterweight 52. In one embodiment, the counterweight 52 includes a long side and a short side. The channels are parallel with the long side and the long side is configured to be parallel with the axis of the LED lamp or substantially parallel with the direction of airflow to make the air flow smoothly.

As shown in FIG. 15, the electronic components include heat-generating elements which generate heat when working. At least one heat-generating element is adjacent to a heat dissipating assembly to dissipate part of heat through the heat dissipating assembly. Preferably, transformers, inductors, resistors, diodes, transistors or ICs of the heat-generating elements are adjacent to the heat dissipating assembly. More preferably, transformers, inductors, resistors, diodes, transistors or ICs of the heat-generating elements are in direct contact with the heat dissipating assembly.

In one embodiment of the present invention, two opposite sides of the circuit board all comprise the counterweight 52, such that the heat dissipating efficiency of the circuit board 51 and the weight balance between two sides of the circuit board 51 can be improved simultaneously.

As shown in FIG. 15, in some embodiments, the power board 51 is divided into a first mounting zone 511 and a second mounting zone 512 by an axis X. The axis X is between the first mounting zone 511 and the second mounting zone 512 as a border. The second mounting zone 512 is greater than the first mounting zone 511 in number of electronic components to make airflow of the first mounting zone 511 smooth and to reduce obstruction of the electronic components. In this embodiment, both the first mounting zone 511 and the second mounting zone 512 have heat-generating elements to distribute heat sources.

Figure 18:
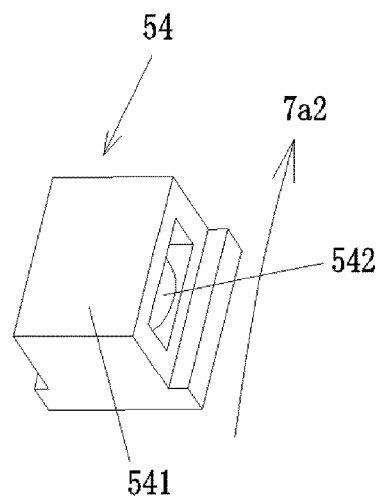
FIG. 18 is a schematic view of a transformer, according to one embodiment of the present invention.

As shown in FIGS. 4, 15 and 18, in some embodiments, the first heat dissipating channel 7a includes an inner channel 7a1 and an outer channel 7a2. The outer channel 7a2 is formed between the electronic components on an edge of the power board 51 and an inner wall of the inner chamber of the lamp shell 2. The inner channel 7a1 is formed in gaps between the electronic components. This arrangement can enhance an effect of heat dissipation of the power source 5. In detail, the power board 51 in FIG. 15 is divided into two portions (a left portion and a right portion, not necessarily symmetrical), namely, a first portion and a second portion. Both the first portion and the second portion have electronic components. The outer channel 7a2 is formed between the electronic components on both the first portion and the second portion and the inner wall of the lamp shell 2. The inner channel 7a1 is formed between the electronic components separately on the first portion and the second portion. In this embodiment, a transformer 54 of the electronic components includes a core 541 and coils 542. The core 541 has a chamber in which the coils 542 are disposed. An opening is formed at a side of the chamber in a radial direction to expose the coils 542. The opening corresponds to the inner channel 7a1 or the outer channel 7a2 to make heat from the coils 542 is rapidly ejected through convection in the inner channel 7a1 or the outer channel 7a2. Preferably, two openings are separately formed at two sides of the chamber in a radial direction. One of the two openings corresponds to the inner channel 7a1 and the other one thereof corresponds to the outer channel 7a2 to further enhance heat dissipation of the transformer.

As shown in FIGS. 1, 2, 3 and 4, the lamp shell 2 includes the lamp head 23, the lamp neck 22 and the sleeve 21. The lamp head 23 connects to the lamp neck 22 which connects to the sleeve 21. The sleeve 21 is located in the heat sink 1 (in the axial direction of the LED lamp, all or most of the sleeve 21, for example, at least 80% of height of the sleeve 21, does not exceed the heat sink 1). The lamp neck 22 projects from the heat sink 1. Both the sleeve 21 and the lamp neck 22 can provide sufficient space to receive the power source 5 and perform heat dissipation, especially for the power source 5 of a high power LED lamp (in comparison with a low power LED lamp, a power source of a high power LED lamp has more complicated composition and larger size). The power source 5 is received in both the lamp neck 22 and lamp head 23. Total height of the lamp neck 22 and the lamp head 23 is greater than height of the heat sink 1 so as to provide more space for receiving the power source 5. The heat sink 1 is separate from both the lamp neck 22 and the lamp head 23 (not overlap in the axial direction, the sleeve 21 is received in the heat sink 1). Thus, the power source 5 in both the lamp neck 22 and the lamp head 23 is affected by the heat sink 1 slightly (heat of the heat sink 1 would not be conducted to the lamp neck 22 and the lamp head 23 along a radial direction). In addition, the configuration of height of the lamp neck 22 is advantageous to the chimney effect of the first heat dissipating channel 7a to guarantee convection efficiency of the first heat dissipating channel 7a. In other embodiments, height of the lamp neck 22 is at least 80% of height of the heat sink 1 to accomplish the above function. The sleeve 21 is made of a thermo-isolated material to prevent mutual influence of heat from the fins and the power source.

As shown in FIG. 2, the second air inlet 1301 is located in a lower portion of the heat sink 1 and radially corresponds to an inner side or the inside of the heat sink 1, i.e. the second air inlet 1301 radially corresponds to the inner side or the inside of the fins 11. The inner side or the inside of the fins 11 corresponds to an outer wall (a radially inner side of the fins 11, which nears or abuts against the sleeve 21) of the sleeve 21 of the lamp shell 2. Thus, after convection air flows into the second air inlet 1301, it flows upward along the outer wall of the sleeve 21 to perform convection and radially dissipates heat in the inner side or the inside of the fins 11 and the outer wall of the sleeve 21 to implement an effect of thermal isolation. That is, this can prevent heat of the heat sink 1 is conducted from the outer wall of the sleeve 21 to the inside of the sleeve 21 not to affect the power source 5. From the above, the second heat dissipating channel 7b can not only enhance heat dissipation of the fins 11, but also implement an effect of thermal isolation. Make a positional comparison between the second air inlet 1301 and the LED chips 311, the second air inlet 1301 is located radially inside all of the LED chips 311.

Figure 19:
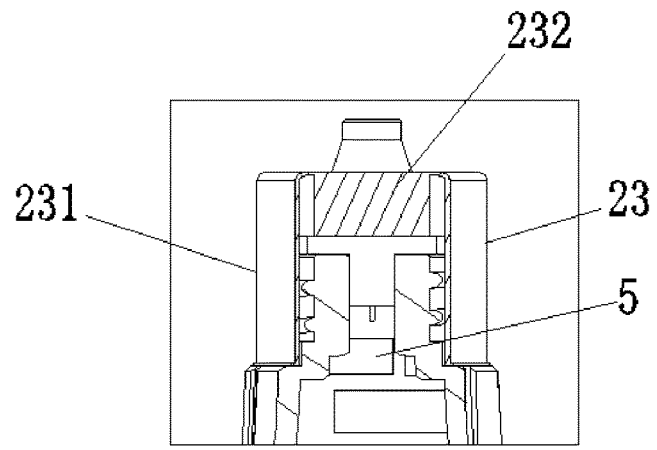
FIG. 19 is an enlarged view of portion B in FIG. 2.
Figure 20:
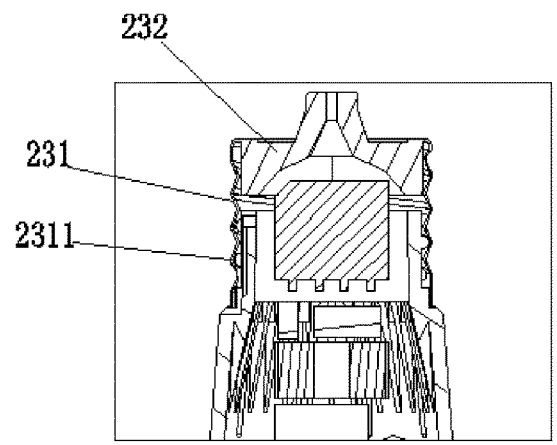
FIG. 20 is a partially schematic view of an LED lamp.

FIG. 19 is an enlarged view of portion B in FIG. 2. As shown in FIG. 19, the lamp head 23 includes a metal portion 231 and an insulative portion 232. Wires of the power source 5 penetrates through the insulative portion 232 to connect with an external power supply. The metal portion 231 connects to the lamp neck 22. In detail, as shown in FIG. 20, an inner surface of the metal portion 231 is provided with a thread through which the lamp neck 22 can be screwed on with the metal portion 231. While the metal portion 231 is dissipating heat generated from the power source 5 in the lamp shell 2 (as described in the above embodiment, at least part of the inner wall of the metal portion 231 forms a wall of the inner chamber of the lamp shell 2, so the thermal conductor directly connects with the metal portion 231 and the metal portion 231 can be used for heat dissipation), an outer surface of the metal portion 231 is formed with a projecting structure 2311 as shown in FIG. 20 to add surface area of the outer surface of the metal portion 231 and enlarge heat dissipating area of the metal portion 231 to increase efficiency of heat dissipation. As for the power source 5, at least part of the power source 5 is located in the lamp head 23, and at least part of heat generated from the power source 5 can be dissipated through the lamp head 23. The inner wall of the metal portion 231 may also be formed with a projecting structure to add surface area of the inner chamber of the lamp shell 2. In this embodiment, the projecting structure can be implemented by forming a thread on the inner surface of the metal portion 231.

As shown in FIGS. 21 to 29, the present disclosure provides a power supply module for LED lamp. The power supply module includes input ends (ACN, ACL) for receiving AC driving signal; a first rectifying circuit 100 for converting the AC driving signal into rectified signal; a filtering 200 for converting the rectified signal into filtered signal; a power converter 400 for converting the filtered signals into power signal which is capable of lighting up an LED light source 500; and a bias generating circuit 600 electrically connected to the input ends (ACN, ACL) and the power converter 400 for performing buck-conversion to the AC driving signal to generate a working voltage of the power converter 400.

In the power supply module of certain embodiments, the bias generating circuit 600 performs buck-conversion to the AC driving signal and converts the AC driving signal into a working voltage of the power converter 400. The working voltage is provided to the power converter 400 so that the power converter 400 can drive the LED light source 500 to emit light. It can be seen that, by utilizing the bias generating circuit 600 to perform active power conversion to externally input AC driving signal, to the working voltage can be generated rapidly generate the so as to effectively improve starting speed of an LED lamp.

Figure 22:
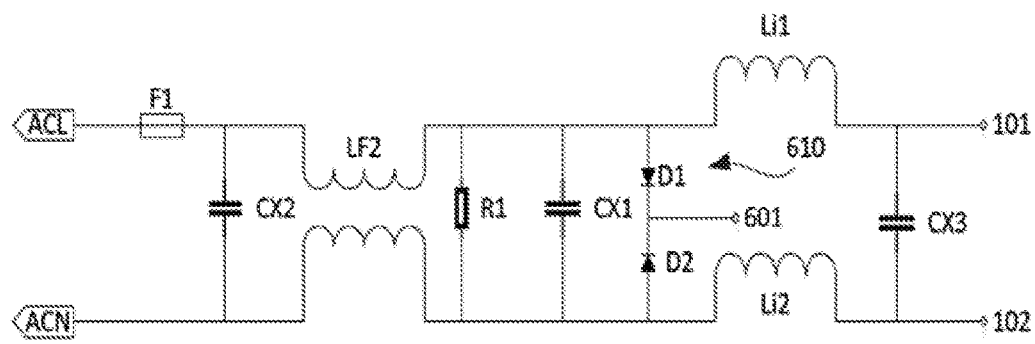
FIG. 22 is a circuit diagram of an EMI reduction circuit of an embodiment of the invention.

The power supply module can be applied to high power LED lamps. Output power of the power converter 400 may be above 30 W. As shown in FIG. 22, the input ends (ACN, ACL) may be two ends of the power supply module: a first end ACL and a second end ACN. The AC driving signal is input through the two ends. The AC driving signal may be AC signal of 220V or any other voltage values. Of course, the input ends (ACN, ACL) may have more than two ends, for example, four ends. It is not limited as long as AC power can be input.

Figure 23:
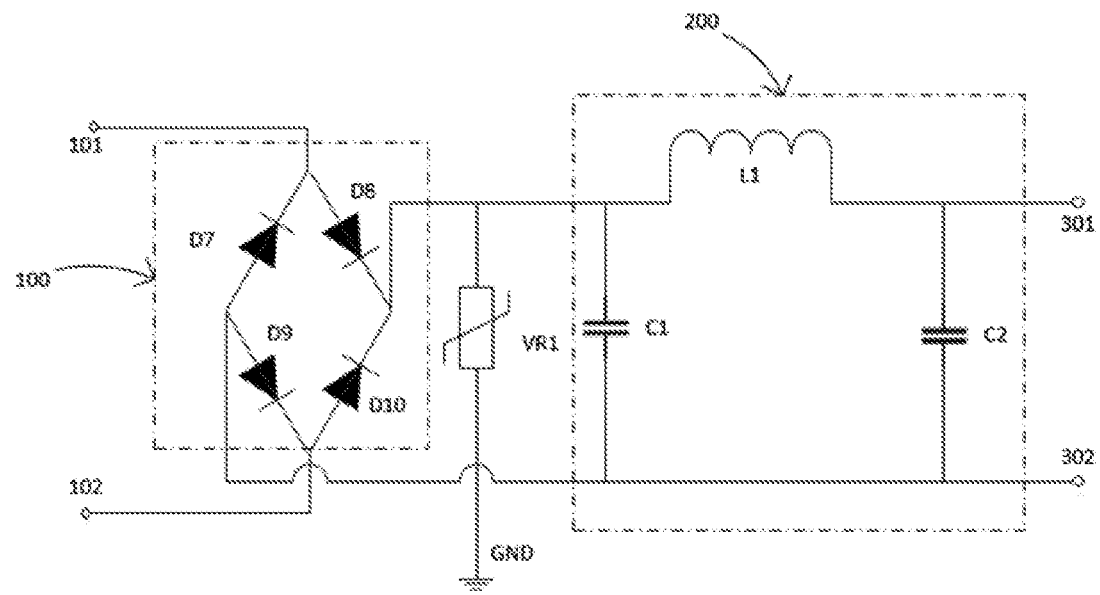
FIG. 23 is a circuit diagram of a rectifier and a filter of an embodiment of the invention.

In this embodiment, the first rectifying circuit 100 may be a bridge rectifier. As shown in FIG. 23, which is a circuit diagram of a rectifying circuit and a filtering circuit of an embodiment of the invention, the first rectifying circuit 100 includes diodes D7, D8, D9 and D10. The first rectifying circuit 100 performs full wave rectification to the AC driving signal to generate DC driving signal (DC power).

In detail, as shown in FIG. 23, anodes of diodes D7, D9 are electrically connected to a first end of the filtering circuit 200, cathodes of diodes D7, D9 are electrically connected to anodes of diodes D8, D10, and cathodes of diodes D8, D10 are electrically connected to a second end of the filtering circuit 200. Contacts of diodes D7 and D8 are electrically connected to the first end ACL. A cathode of diode D8 is electrically connected to a cathode of diode D10. Contacts of diodes D9 and D10 are electrically connected to the second end ACN.

In this embodiment, the filtering circuit 200 includes capacitors C1, C2 and an inductor L1. First ends of both capacitor C1 and inductor L1 serve as the second end of the filtering circuit 200 to electrically connect with cathodes of diodes D8 and D10. The second end of inductor L1 is electrically connected to the first end of capacitor C1. The second ends of capacitors C1 and C2 serve as the first end of the filtering circuit 200 to electrically connect with anodes of diodes D7 and D9. The filtering circuit 200 receives the DC power (the rectified signal) rectified by the first rectifying circuit 100 and filters high frequency components of the DC power. The DC power filtered by the filtering circuit 200 is a relatively flat DC waveform. The filtered signal is sent to a post-stage circuit through connecting ends 301 and 302.

An electro-magnetic interference (EMI) reduction circuit 900 may be disposed between the input ends (ACN, ACL) and the rectifying circuit 100. The EMI reduction circuit 900 can reduce influence to the driving signal from an interference magnetic field. In the EMI reduction circuit 900, a power line (including a main line and/or a branch of the main line) electrically connected to two ends of the input ends ACN, ACL is electrically connected with an excitation coil LF2 connecting a resistor branch (e.g. a branch at which resistor R1 is located) and capacitor branches (e.g. branches at which capacitors CX1, CX2, CX3 are located), and separately electrically connecting inductor Li1, Li2 at two branches.

In this embodiment, the power converter 400 converts the filtered signal into an electrical signal which is capable of lighting up the LED light source 500. The power converter 400 may change voltage level of the filtered signal to generate DC driving signal with target voltage value. The power converter 400 has an output end for outputting DC driving signal with target voltage values.

Figure 21:
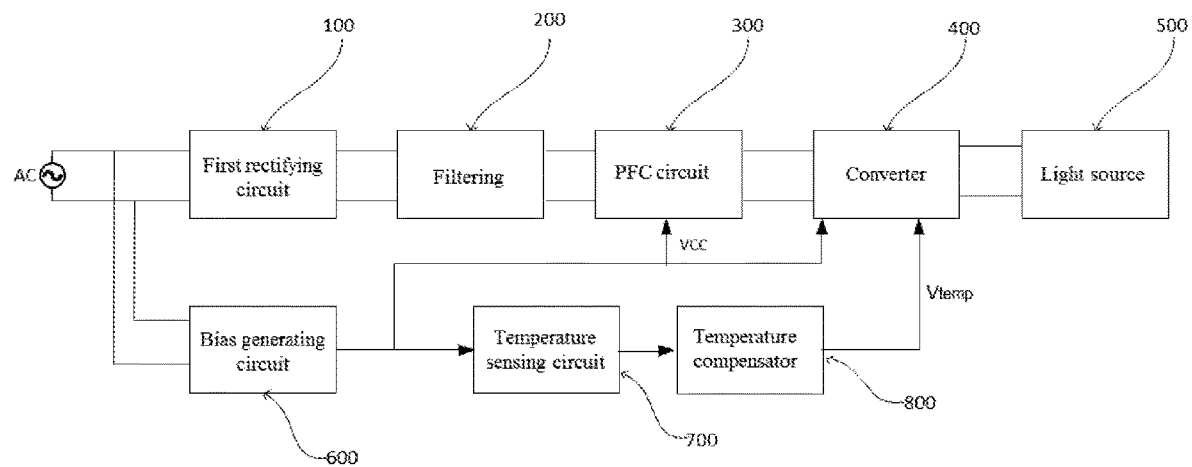
FIG. 21 is a block diagram of the power module of an embodiment of the invention.
Figure 25:
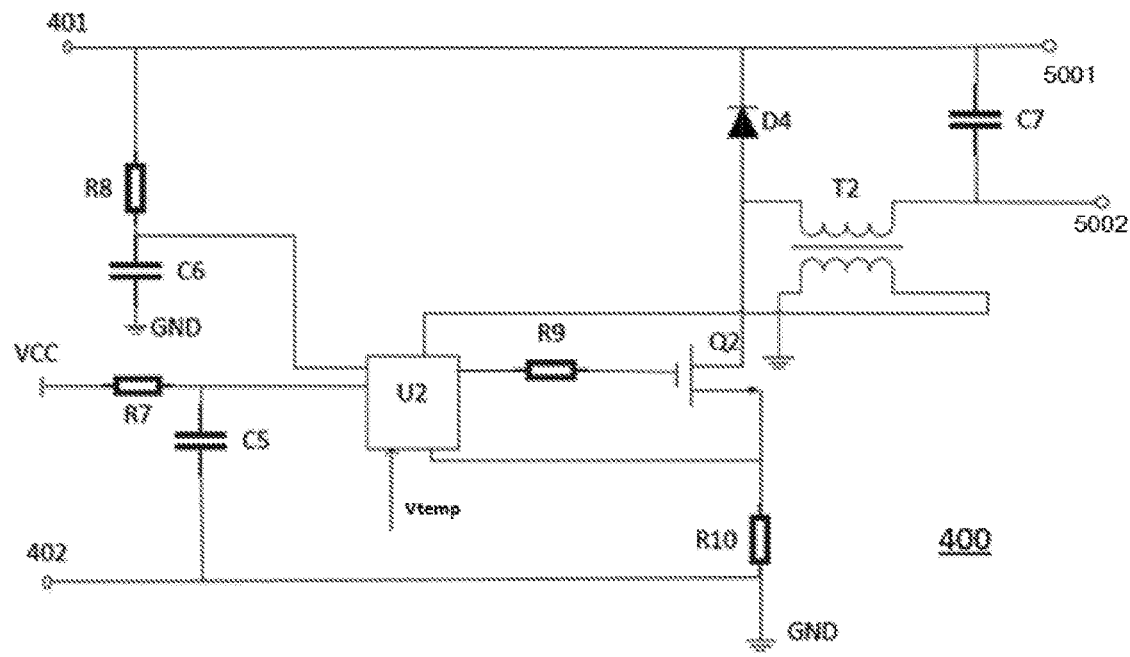
FIG. 25 is a circuit diagram of a power converter of an embodiment of the invention.

FIG. 25 is a circuit diagram of a power converter of an embodiment of the invention. As shown in FIGS. 21 and 25, the power converter 400 receives signal from a prestage circuit through the connecting end 401, 402, and the power signal are provided to a post-stage through the connecting ends 5001, 5002. The power converter 400 may adopt a PWM (Pulse Width Modulation) circuit, which controls pulse width to output target signal. In detail, the power converter 400 includes a controller U2, a power switch Q2, a transformer T2 and a diode D10. Controller U2, power switch Q2, diode D10 and an energy storage coil (a coil of the transformer T2, which is electrically connected between the power switch Q2 and the connecting end 5002) cooperate to output power signal (DC driving signal) with required voltage and/or current. The controller U2 is activated by a working voltage VCC provided by the bias generating circuit 600 to output PWM control signal to control switching of the power switch Q2, so that the energy storage coil repeatedly charge and discharge in response to the switching state of power switch and the continuity of the current can be maintained through diode D4 (which is operated as a flyback diode), and thus generate the required power signal between the connecting ends 5001, 5002.

Power switch Q2 may be a MOSFET. A first end (power end) of controller U2 electrically connects to an output end of the bias generating circuit 600. A second end of controller U2 electrically connects to an end of transformer T2. An end of the energy storage coil of transformer T2 electrically connects to a negative end (i.e. connecting end 5002) of the DC output ends and the other end thereof electrically connects to an anode of diode D4. An anode of diode D4 electrically connects to a positive end (i.e. the connecting end 5001) of the DC output ends. An end of the induction coil of transformer T2 electrically connects to a second end of controller U2 and the other end of the induction coil is grounded. A third end of controller U2 electrically connects to a control end of power switch Q2 through resistor R9. A first end of power switch Q2 electrically connects to a connecting point between diode D4 and transformer T2, and a second end of power switch Q2 connects to a fourth end of controller U2. Power converter 400 may be further provided with a sampling circuit to sample its working status and serve as a reference of output signal of the controller U2.

For example, the sampling circuit includes resistors R8, R10, capacitor C6 and an induction coil of the transformer T2. The controller U2 may sample voltage of the main line from resistor R8 and capacitor C6 through its first end, sample output current from the induction coil through its second end and sample current flowing through the power switch Q2 from an end of resistor R10 through its fourth end. Configuration of the sampling circuit is related to the control manner of the controller U2, the invention is not limited to this embodiment.

In this embodiment, at least one end of the switch controller U3 electrically connects to a branch at which inductor L2 is located. A filtering element and/or current stabilizer may be added between the switch controller and the inductor. The present invention is not limited thereto.

To reduce both influence resulting from harmonic to circuit properties and conversion loss, a power factor correction (PFC) circuit 300 may be disposed between the power converter 400 and filtering circuit 200. The PFC circuit 300 can increase power factors of the filtered signal by adjusting signal properties (e.g. phase, level or frequency) of the filtered signal. PFC circuit 300 electrically connects to an output end of bias generating circuit 600. In detail, PFC circuit 300 may be an active PFC circuit.

Figure 24:
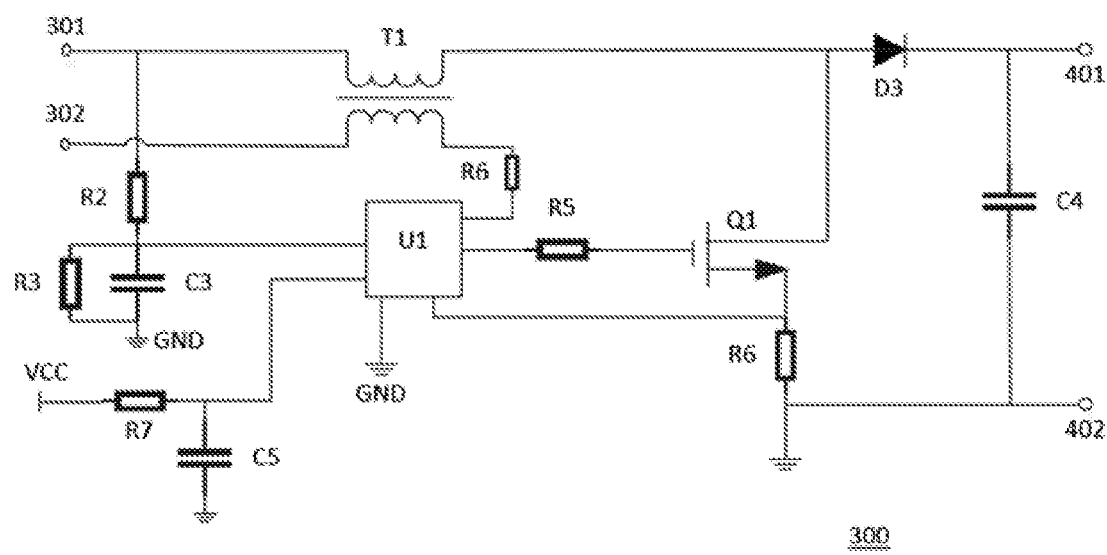
FIG. 24 is a circuit diagram of a PFC of an embodiment of the invention.

FIG. 24 is a circuit diagram of a PFC circuit of an embodiment of the invention. As shown in FIG. 24, PFC circuit 300 receives signal from the filtering circuit 300 through the connecting ends 301, 302 and sends corrected signal to the post-stage power converter 400 through connecting ends 401, 402. PFC circuit 300 includes a controller U1, a power switch Q1 electrically connected to controller U1, a transformer T1 and a diode D3. Power switch Q1 may be a MOSFET. A first end (power end) of the controller U1 electrically connects to an output end 607 of bias generating circuit 600. A second end of controller U1 electrically connects to an end of transformer T1. A coil of transformer T1 electrically connects to a main branch in series. The other end of the coil electrically connected to a second end of controller U1 is grounded. A positive end (also called connecting end 5001) of the DC output ends electrically connects to the main branch. Diode D3 is electrically connected in the branch in series. An anode of diode D3 electrically connects to both an end of transformer T1 and the filtering circuit 200, and a cathode thereof electrically connects to connecting end 401 for electrically connecting to both power converter 400 and connecting end 5001. A third end of controller U1 electrically connects to power switch Q1. An end of power switch Q1 electrically connects to a fifth electrically connecting point between diode D3 and transformer T1. Controller U1 may further electrically connects to a sampling circuit (a connecting point between resistor R2 and capacitor C3 electrically connects to the controller U1, and capacitor C3 electrically connects to resistor R3 in parallel) and other circuits as shown in FIG. 24.

Figure 26:
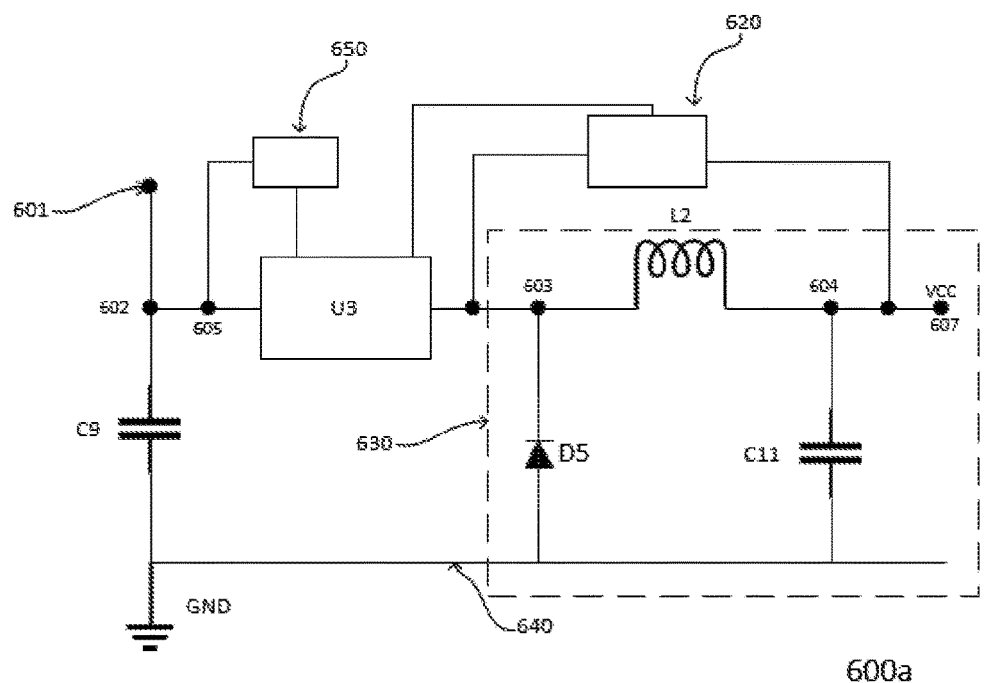
FIG. 26 is a circuit diagram of a bias generator of an embodiment of the invention.

FIG. 26 is a circuit diagram of a bias generating circuit of the first embodiment of the invention. As shown in FIGS. 22 and 26, bias generating circuit 600a may include an electricity obtainer 610, a switch controller U3 and an energy storage flyback unit 630. Electricity obtainer 610 electrically connects to both the input ends (ACN, ACL) and switch controller U3. Switch controller U3 electrically connects to energy storage unit 630 having an output end 607 for outputting a working voltage (VCC). Output end 607 electrically connects to power converter 400 to provide the working voltage (VCC) to the power converter 400.

Switch controller U3 controls switching frequency of the energy storage unit 630 according to an electricity obtaining signal from the electricity obtainer 610 to generate the working voltage of the power converter 400 and uses the output end 607 to output the working voltage to the power converter 400. The switch controller U3 is activated by responding to the electricity obtaining signal from the electricity obtainer 610 and repeatedly switches on and off to periodically charge and discharge by controlling conducting time of the energy storage unit 630. And diode D5 is used to keep flyback. Thus, the working voltage of the power converter 400 is formed and is output to the power converter 400 through the output end 607.

In an embodiment, the electricity obtainer 610 can convert AC driving signal into DC electricity obtaining signal which are equal to the AC driving signal. As shown in FIGS. 22 and 26, electricity obtainer 610 can be implemented by a second rectifying circuit (hereinafter "second rectifying circuit 610"). Second rectifying circuit 610 includes a first diode D1 and a second diode D2, which are electrically connected in series with opposite polarity (i.e. cathodes of diodes D1 and D2 are electrically connected together). Second rectifying circuit 610 has an electricity obtaining end 601 between diodes D1 and D2. The electricity obtaining end 601 electrically connects to the switch controller U3. By the opposite polarity, the two diodes D1 and D2 rectify the AC driving signal to output DC driving signal at the electricity obtaining end 601.

In detail, the electricity obtaining end 601 further electrically connects to an end of first capacitor C9, and the other end thereof electrically connects to the ground end GND. Switch controller U3 electrically connects to an end of inductor L2, and the other end thereof connects to the output end 607. Inductor L2 can perform both energy storage and release and maintain the current continuity when switch controller U3 is switching.

In this embodiment, energy storage flyback unit 630 may include an inductor L2, a third diode D5 and a second capacitor C11. A cathode of the third diode D5 connects to a connecting end 603 disposed between the switch controller U3 and inductor L2. An anode of third diode D5 connects to ground end GND. An end of second capacitor C11 electrically connects to a second connecting end 604 disposed between inductor L2 and the output end 607. The other end of second capacitor C11 electrically connects to the ground end GND. an end of a load resistor electrically connects to a third connecting end (not shown in FIG. 22) disposed between the second connecting end 604 and the output end 607. The other end of the load resistor electrically connects to ground end GND.

Further, switch controller U3 may be a MOSFET switch or an IC ship integrated with a MOSFET switch. Of course, in some embodiments, switch controller U3 may be a BJT switch. Switch controller U3 has multiple connecting ends (also called connecting port). An electricity obtaining branch is formed between the electricity obtaining end 601 and the ground end GND. The first capacitor C9 is connected in the electricity obtaining branch in series. At least one connecting end of switch controller U3 electrically connects to the electricity obtaining end 601 through the electricity obtaining branch. A branch at which both the electricity obtaining branch and capacitor C9 are located electrically connects to the electricity obtaining end 601 through the fourth connecting end 602. The ground end GND electrically connected to a grounding line 640. All of the third diode D5, the second capacitor C11 and the load resistor electrically connect to the grounding line 640.

The bias generating circuit 600 may be further provided with a sampling circuit to sample its working status and to be a reference of output signal of the switch controller. In addition, in the practical application, switch controller U3 may be a chip or IC integrated with at least a control circuit and a power switch, but the present invention is not limited thereto.

For example, the sampling circuit may include a first sampling circuit 650 and a second sampling circuit 620. First sampling circuit 650 electrically connects to both the electricity obtaining end 601 (forming a connecting point 605 in FIG. 26) and switch controller U3. The second sampling circuit 620 electrically connects to both the output end 607 and switch controller U3. Switch controller U3 outputs a stable working voltage according to sampling signal from both the first sampling circuit 650 and second sampling circuit 620. Configuration of the sampling circuit is related to the control manner of switch controller U3, the invention is not limited to this. FIG. 26 is a circuit diagram of the bias generating circuit of the first embodiment of the invention.

Figure 27:
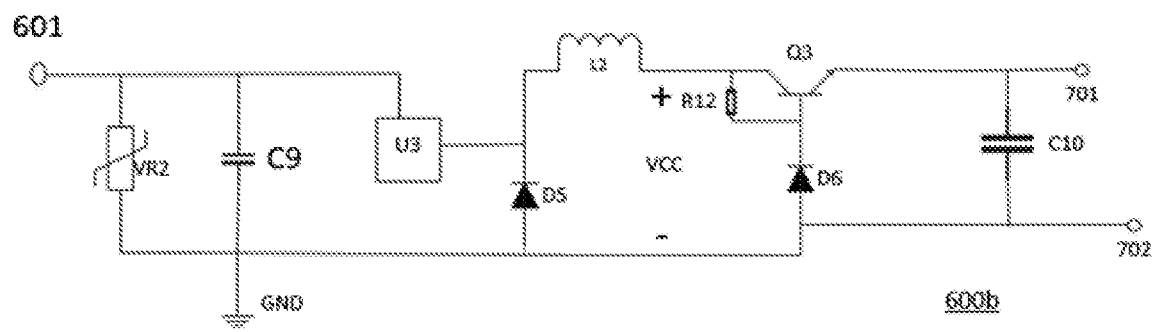
FIG. 27 is a circuit diagram of a bias generator of another embodiment of the invention.
Figure 28:
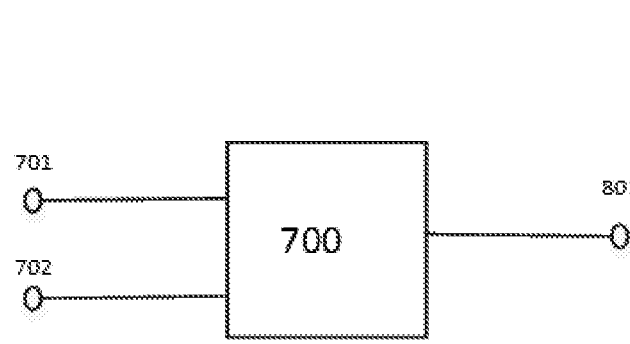
FIG. 28 is a circuit diagram of a temperature detector of an embodiment of the invention.

In other embodiments, the bias generating circuit may also be used for providing a working voltage to a temperature sensing circuit 700. FIG. 27 is a circuit diagram of the bias generating circuit of the second embodiment of the invention. FIG. 28 is a circuit diagram of a temperature sensing circuit of an embodiment of the invention. As shown in FIGS. 27 and 28, the temperature sensing circuit 700 electrically connects to power converter 400 for sending temperature detecting signal to power converter 400. The temperature sensing circuit 700 has a temperature sensor electrically connecting to bias generating circuit 600b to make bias generating circuit 600b provide a working voltage to temperature sensing circuit 600b.

In this embodiment, in comparison with the embodiment shown in FIG. 26, the bias generating circuit 600b of this embodiment further includes a transistor Q3, a diode D6, a resistor R12 and a capacitor C10. Transistor Q3 may be a BJT as an example (hereinafter refer as BJT Q3). The temperature detector 700 electrically connects to BJT Q3 of the bias generating circuit 600b. The collector of BJT Q3 electrically connects to output end 607. The base of BJT Q3 electrically connects to the grounding line with the ground end GND.

The temperature sensing circuit 700 is activated by responding to the working voltage provided by the bias generating circuit 600b through the connecting ends 701 and 702 and feeds temperature data (Vtemp) back to the controller U2 of the power converter 400. When a temperature exceeds a threshold value (indicating a situation of overheating), the controller U2 of the power converter 400 would reduce output power to decrease temperature and guarantee the safety during operation.

Figure 29:
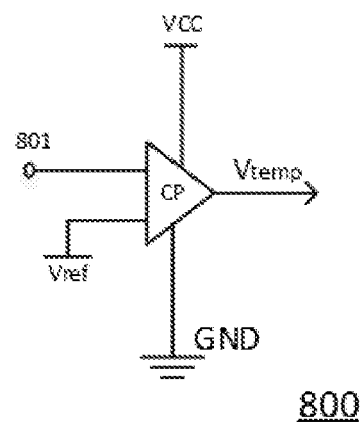
FIG. 29 is a circuit diagram of a temperature compensator of an embodiment of the invention.

Moreover, as shown in FIG. 29, the temperature sensing circuit 700 further electrically connects to a temperature compensator 800. FIG. 29 is circuit diagram of a temperature compensator of an embodiment of the invention. Temperature sensing circuit 700 electrically connects between temperature compensator 800 and bias generating circuit 600b. Temperature compensator 800 electrically connects to power converter 400.

Temperature compensator 800 makes a reference temperature of a free end of the temperature sensing circuit more reasonable. The temperature compensator 800 in this embodiment can be implemented by a comparator CP (but not limited to this). An input end of comparator CP receives a voltage, indicating a temperature information, through connecting end 801 and compares the voltage indicating the temperature information with a reference voltage Vref of another input end of comparator CP, such that whether the temperature sensed by the temperature sensing circuit 700 exceeds a threshold value can be determined and a temperature sensing result signal Vtemp indicating whether the sensed temperature exceeds a threshold value is generated at an output end of the comparator CP. The output end of the temperature compensator 800 electrically connects to the controller U2 of the power converter 400 to make the temperature sensing result signal Vtemp fed back to controller U2 of power converter 400, so that controller U2 can adjust the output power depending on the system environment temperature.

In another embodiment, the temperature compensator 800 may have a regulator diode and a thermistor. After the thermistor, the temperature compensator 800 electrically connects to an amplifier through an adjustable potentiometer. A negative end of the amplifier electrically connects to an output end of the temperature compensator 800.

In detail, a circuit diagram of the temperature compensator 800 may be as shown in FIG. 29. It should be noted that, the temperature compensator 800 can be implemented by various manners. The invention is not limited to the circuit shown in FIG. 29.

The invention further provides a high power LED lamp including an LED light source 500 and a power supply module as abovementioned connecting with the LED light source 500. In some embodiments, the high power LED lamp means all types of LED lamps whose output power exceeds 30 w, LED lamps which are equivalent to xenon lamps with output power of at least 30 W or LED lamps using high power lamp beads (e.g. lamp beads with rated current above 20 mA).

All digital values mentioned in the description include all values between an upper limit and a lower limit with upper or lower values of increment or decrement by one unit, an interval of at least two units between any lower value and its higher value is available. For example, if a value of a recited quantity of an element or a process variable (e.g. temperature, pressure, time, etc.) is between 1 and 90, preferably, between 20 and 80, more preferably, between 30 and 70, it means inclusion of between 15 and 85, between 22 and 68 , between 43 and 51, between 30 and 32, etc. For a value less than 1, one unit may be properly deemed as 0.0001, 0.001, 0.01 and 0.1. This merely intents to clearly express exemplary values. That is, all values and their combinations between the lowest value and the highest value are included in ranges described in the specification.

The above depiction has been described with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

What is claimed is:

1. An LED (light emitting diode) lamp comprising:
   a lamp shell including a lamp head, a lamp neck and a sleeve, the lamp head connects to the lamp neck which connects to the sleeve;
   a passive heat dissipating element having a heat sink connected to the lamp shell, wherein the heat sink comprises fins and a base, the sleeve of the lamp shell is located in the heat sink, the lamp neck projects from the heat sink, height of the lamp neck is at least 80% of height of the heat sink;
   a power source having a first portion and a second portion, wherein the first portion of the power source is disposed in both the lamp neck and the lamp head of the lamp shell, and the second portion of the power source is disposed in the heat sink of the passive heat dissipating element;
   a light emitting surface connected to the heat sink of the passive heat dissipating element and comprising LED chips electrically connected to the power source, wherein the light emitting surface and the heat sink are connected to form a heat transferring path from the LED chips to the passive heat dissipating element;
   a first heat dissipating channel formed in a first chamber of the lamp shell for dissipating heat generated from the power source while the LED lamp is working, and the first chamber is located between the bottom of the LED lamp and the upper portion of the lamp neck;
   a second heat dissipating channel formed in the heat sink and between the fins and the base for dissipating the heat generated from the LED chips and transferred to the heat sink; and
   a lamp cover connected with the heat sink and having a light output surface and an end surface, wherein the end surface is formed with a vent to allow air flowing from outside of the LED lamp into both the first heat dissipating channel and the second heat dissipating channel through the vent;
   wherein the first heat dissipating channel comprises a first end on the light emitting surface to allow air flowing from outside of the LED lamp into the first chamber, and a second end on the upper portion of the lamp neck of the lamp shell to allow air flowing from inside of the first chamber out to the LED lamp;
   wherein the second heat dissipating channel comprises a third end on the light emitting surface to allow air flowing from outside of the LED lamp into the second heat dissipating channel, and flowing out from spaces between every adjacent two of the fins;
   wherein the power source includes a power board and a plurality of electronic components mounted thereon;
   wherein the power board is divided into a first mounting zone and a second mounting zone, total weight of the electronic components on the second mounting zone is greater than total weight of the electronic components on the first mounting zone, and a counterweight is provided on the first mounting zone to balance the two zones of the power board in weight.

2. The LED lamp of claim 1, wherein the first heat dissipating channel includes an inner channel and an outer channel, the outer channel is formed between the electronic components on an edge of the power board and an inner wall of the first chamber of the lamp shell, the inner channel is formed in gaps between the electronic components, a transformer of the electronic components includes a core and coils, the core has a second chamber in which the coils are disposed, an opening is formed at a side of the second chamber in a radial direction to expose the coils, the opening corresponds to the inner channel or the outer channel.

3. The LED lamp of claim 2, wherein two openings are separately formed at two sides of the second chamber in a radial direction, one of the two openings corresponds to the inner channel and the other one thereof corresponds to the outer channel.

4. The LED lamp of claim 3, wherein the electronic components include heat-generating elements, at least one of the heat-generating element is in thermal contact with the lamp head through a thermal conductor, the at least one of the heat-generating element is disposed in the lamp head.

5. The LED lamp of claim 4, wherein the thermal conductor is disposed in the lamp head through filling to implement connection between the lamp head and the heat-generating element, the thermal conductor only cloaks an end portion of the power source and is higher than the second end on the upper portion of the lamp neck of the lamp shell in position.

6. The LED lamp of claim 5, wherein the lamp head includes a metal portion, at least part of an inner side of the metal portion constitutes a wall of the inner chamber of the lamp shell to make the thermal conductor directly connect with the metal portion.

7. The LED lamp of claim 6, wherein at least one of the electronic components of the power source, which is most adjacent to the first end of the first heat dissipating channel is an electrolytic capacitor.

8. The LED lamp of claim 7, part of the electrolytic capacitor exceeds the power board in the axial direction of the LED lamp.

9. The LED lamp of claim 8, wherein the counterweight is a heat dissipating element with heat dissipating function and is disposed on the power board.

10. The LED lamp of claim 9, wherein the heat dissipating assembly has fins for increasing heat dissipating area, the fins are extendedly arranged along the axial direction of the LED lamp, a channel is formed between two adjacent fins as an air passage.

11. The LED lamp of claim 10, wherein an aperture is located in a central region of the light board, and the aperture forms an air intake of both the first heat dissipating channel and the second heat dissipating channel.

12. The LED lamp of claim 11, wherein the sleeve corresponds to the aperture.

13. The LED lamp of claim 12, wherein the heat sink comprises first fins and second fins, bottoms of both the first fins and the second fins in an axis of the LED lamp connect to the base, the first fins interlace with the second fins at regular intervals, and one of the second fins includes a third portion and two fourth portions, the two fourth portions are symmetrical about the third portion.

14. The LED lamp of claim 13, wherein each of the first fins is divided into two portions in a radial direction of the LED lamp, the two portions are divided with a gap portion, the third portion is connected to the fourth portion through a transition portion, the transition portion has a buffer section and a guide section, a direction of any tangent of the guide section is separate from the gap portion.

15. The LED lamp of claim 14, wherein the power board has a first portion in the lamp neck and a second portion in the sleeve, the second portion more adjacent to the first end of the first heat dissipating channel than the first portion.

16. The LED lamp of claim 15, wherein at least part of the electrolytic capacitors are disposed in the second portion.

17. The LED lamp of claim 15, wherein all of the electrolytic capacitors are disposed in the second portion.

\* \* \* \* \*